(12) United States Patent
Lee et al.

(10) Patent No.: US 7,758,818 B2
(45) Date of Patent: Jul. 20, 2010

(54) SCRUBBER FOR PROCESSING SEMICONDUCTOR WASTE GAS

(75) Inventors: Young Chan Lee, Gyeonggi-do (KR); Hyung Geuk Kim, Gyeonggi-do (KR); Sang Keun Lee, Incheon (KR)

(73) Assignee: Clean Systems Korea Inc. (KR)

( * ) Notice: Subject to any disclaimer, the term of this patent is extended or adjusted under 35 U.S.C. 154(b) by 863 days.

(21) Appl. No.: 11/514,516

(22) Filed: Sep. 1, 2006

(65) Prior Publication Data
US 2007/0053803 A1  Mar. 8, 2007

(30) Foreign Application Priority Data

| Sep. 2, 2005 | (KR) | ...................... 10-2005-0081838 |
| Sep. 5, 2005 | (KR) | ...................... 10-2005-0082274 |
| Feb. 6, 2006 | (KR) | ...................... 10-2006-0011011 |
| Feb. 6, 2006 | (KR) | ...................... 10-2006-0011012 |
| Feb. 6, 2006 | (KR) | ...................... 10-2006-0011013 |

(51) Int. Cl.
*B01D 50/00* (2006.01)
*B01D 53/34* (2006.01)

(52) U.S. Cl. .................. 422/168; 422/169; 422/170
(58) Field of Classification Search ................ 422/168, 422/169, 170
See application file for complete search history.

(56) References Cited

U.S. PATENT DOCUMENTS

| 6,423,284 | B1 * | 7/2002 | Arno et al. ............. 423/240 R |
| 2002/0081240 | A1 * | 6/2002 | Kim ......................... 422/171 |
| 2003/0049182 | A1 * | 3/2003 | Hertzler et al. ............ 422/168 |
| 2004/0055869 | A1 * | 3/2004 | Moore ....................... 204/164 |
| 2004/0141900 | A1 * | 7/2004 | Lei ......................... 423/240 R |
| 2005/0172616 | A1 * | 8/2005 | Reichardt et al. ............ 60/286 |
| 2006/0104878 | A1 * | 5/2006 | Chiu et al. ............. 423/240 R |

FOREIGN PATENT DOCUMENTS

KR  2000-0065525  11/2000

* cited by examiner

*Primary Examiner*—Walter D Griffin
*Assistant Examiner*—Natasha Young
(74) *Attorney, Agent, or Firm*—St. Onge Steward Johnston & Reens LLC

(57) ABSTRACT

Disclosed is a scrubber for processing semiconductor waste gas produced in a semiconductor fabricating process, wherein the scrubber burns the waste gas with a flame of a high temperature, filters and captures particles produced after the waste gas is burnt, and discharges particle-filtered waste gas to the atmosphere. The semiconductor waste gas processing scrubber includes: a supply section for supplying semiconductor waste gas, fuel and oxygen; a burner connected to the supply section so as to burn the semiconductor waste gas by flame; a burning chamber joined to the burner so as to cause particles, which are produced as the semiconductor waste gas is burnt, to drop; a wet tower installed at a side of the burning chamber so as to cause the particles, which are transferred from the burning chamber after adsorbing the particles using water, to drop; and a water reservoir tank connected to the burning chamber and the wet tower so as to capture the particles which have dropped from the burning chamber and the wet tower.

45 Claims, 32 Drawing Sheets

SCRUBBER FOR PROCESSING SEMICONDUCTOR WASTE GAS

CROSS-REFERENCE TO RELATED APPLICATIONS

This application claims priority to and the benefit of Korean Patent Application No. 10-2006-0011011 filed on Feb. 6, 2006, Korean Patent Application No. 10-2006-0011012 filed on Feb. 6, 2006, Korean Patent Application No. 10-2006-0011013 filed on Feb. 6, 2006, Korean Patent Application No. 10-2005-0081838 filed on Sep. 2, 2005 and Korean Patent Application No. 10-2005-0082274 filed on Sep. 5, 2005, in the Korean Intellectual Property Office, the entire contents of which are incorporated herein by references.

FIELD OF THE INVENTION

The present invention relates to a scrubber for processing waste gas from a semiconductor process (hereinafter, to be referred to as "semiconductor waste gas processing scrubber"), and in particular to a semiconductor waste gas processing scrubber, which burns the waste gas from a semiconductor process using flame of high temperature, filters and captures the burnt waste gas using water, and then discharges the filtered and captured gas to the atmosphere.

BACKGROUND OF THE INVENTION

In general, various reaction gases employed for forming films on wafers or etching wafers in a semiconductor manufacturing process contain oxidation components, phosphide components, toxic components, etc. Therefore, if such a reaction gas (hereinafter, to be referred to as "waste gas") is discharged after use to the atmosphere as it is, it is not only harmful to human body but also causes environmental contamination. Consequently, there is provided a scrubber in a semiconductor installation so as to discharge such a waste gas after removing oxidation components, phosphide components, toxic components, etc.

A semiconductor waste gas processing scrubber for removing a waste gas during a semiconductor fabrication process is classified into three types: i) an indirect burning and wet type scrubber, which burns a waste gas and then filters the gas once again using water, wherein the scrubber is also called as a "heat wet scrubber," ii) a wet type scrubber, which captures a waste gas using water and then purifies the water, wherein the scrubber is also called as a "wet scrubber," and iii) a direct burning and wet type scrubber, which burns a waste gas using flame of high temperature and then captures the gas using water, wherein the scrubber is also called as a "burn wet scrubber."

Herein, the semiconductor waste gases are mainly silicon-containing gases, which produce a large quantity of particles when processed by a heat wet scrubber or a bun wet scrubber. An example of a chemical formula may be indicated as follows:

$$SiH_4(gas) + 2O_2 \rightarrow SiO_2 \text{ (particles)} + 2H_2O$$

Like this, if such a semiconductor waste gas is burnt, a large quantity of particles is produced. Therefore, it is possible to substantially reduce the density of harmful components in the semiconductor waste gas if the particles are filtered and captured using water.

However, the conventional semiconductor waste gas processing scrubbers as mentioned above have various problems as follows.

First, a conventional scrubber has a problem in that a burner employed in such a scrubber is not superior in efficiency for burning a semiconductor waste gas and thus cannot completely burn the semiconductor waste gas. That is, there is a problem in that the burner is supplied with fuel and oxygen as well as a semiconductor waste gas, wherein because the waste gas, the fuel and the oxygen are supplied in such a manner as to flow parallel to each other, they are not rapidly mixed with each other, whereby the burner is poor in efficiency for burning the semiconductor waste gas.

Second, the particles, which have been generated after burning the semiconductor waste gas, gradually thickly deposit on the inner wall of a burning chamber due to attractive force and frictional force, and solidified as time goes. Therefore, there is a problem of inconvenience in that the entire inner wall of the burning chamber should be manually cleaned after a given time period has passed. In general, the inner wall of such a burning chamber should be cleaned, usually once every three or four days.

Third, in order to clean the burning chamber as mentioned above, it is necessary to completely separate the burning chamber from a scrubber case. However, in a conventional semiconductor waste gas processing scrubber, the separation and connection of such a burning chamber require very long time because the burning chamber is fixed by a number of bolts and nuts.

Fourth, a wet scrubber or a burn wet scrubber as mentioned above may include a wet tower for injecting a predetermined quantity of water. Apart from spraying water, such a wet tower is typically provided with a plurality of filters so as to filter and remove particles. However, such a scrubber is not effective in that such a wet type tower should be continuously used without changing the assembled condition, even if it is once assembled without considering various process conditions and installation status. In addition, with such a conventional wet tower, it may be occasionally sufficient to clean a specific area when cleaning the inside of the wet tower. In such a case, however, because it is also required to entirely separate the wet tower, it takes very long time to clean the specific area.

Fifth, a wet scrubber or a burn wet scrubber as mentioned above may include a water reservoir tank in which a predetermined quantity of water is contained. Such a water reservoir tank serves to cause particles, which are formed from a semiconductor waste gas as being burnt by flame from a burner, to be captured in water. Of course, such particles and water may be discharged to the outside every predetermined time interval, and fresh water may be supplied to the water reservoir tank. However, the particles captured in the water in the water reservoir tank as described above settle and accumulate on the bottom of the water reservoir tank by weight as time passes. As they are more thickly accumulate due to their weight as time passes, the particles are consequently adhered to the bottom of the water reservoir tank due to the self-weight thereof, whereby the particles are not discharged to the outside even if the water is discharged. Accordingly, the prior art has a problem in that it is necessary to separate and clean the water reservoir tank every predetermined time period, which is significantly labor intensive and time consuming.

SUMMARY OF THE INVENTION

Accordingly, the present invention has been made to solve the above-mentioned problems occurring in the prior art, and an object of the present invention is to provide a semiconductor waste gas processing scrubber with a burner having an improved efficiency of burning a semiconductor waste gas.

Another object of the present invention is to provide a semiconductor waste gas processing scrubber with a burning chamber, the inner wall of which is supplied with pulse waves with a predetermined level of pressure, so that particles cannot deposit on the inner wall of the burning chamber.

Another object of the present invention is to provide a semiconductor waste gas processing scrubber, wherein a burning chamber is adapted to be easily separated, and a chamber support section is provided under the burning chamber so as to allow the burning chamber to be easily attached and detached, so that the burning chamber can be easily maintained and repaired.

Another object of the present invention is to provide a semiconductor waste gas processing scrubber with a wet tower, wherein the connecting state of the upper and lower portions of the wet tower can be optionally changed according to a semiconductor fabrication process and an exhaust condition.

Still, another object of the present invention is to provide a semiconductor waste gas processing scrubber with a water reservoir tank containing water for capturing particles from a semiconductor waste gas, wherein air bubbles are periodically produced in the water, so that the particles captured in the water are not adhered to the bottom of the water reservoir tank.

In order to accomplish the above object, the present invention provides a scrubber for processing semiconductor waste gas including: a supply section for supplying semiconductor waste gas, fuel and oxygen; a burner connected to the supply section so as to burn the semiconductor waste gas by flame; a burning chamber joined to the burner so as to cause particles, which are produced as the semiconductor waste gas is burnt, to drop; a wet tower installed at a side of the burning chamber so as to cause the particles, which are transferred from the burning chamber after adsorbing the particles using water, to drop; and a water reservoir tank connected to the burning chamber and the wet tower so as to capture the particles which have dropped from the burning chamber and the wet tower.

The present invention further may include a chamber support section, which is provided under the lower end of the burning chamber so as to support the burning chamber.

The supply section may include at least one waste gas supply tube connected to the burner so as to supply semiconductor waste gas to the burner; at least one bypass waste gas supply tube connected to the waste gas supply tube so as to bypass the semiconductor waste gas; at least one fuel supply tube connected to the burner so as to supply fuel to the burner; and at least one oxygen supply tube connected to the burner so as to supply oxygen to the burner.

The burner may include a main body having at least one semiconductor waste gas supply passage, at least one fuel supply passage, and at least one oxygen supply passage; a fuel nozzle body fitted on the circumferential edge of the main body, thereby forming a fuel supply space and a fuel supply nozzle; and an oxygen nozzle body fitted on the circumferential edges of the main body and the fuel nozzle body, thereby forming an oxygen supply space and an oxygen supply nozzle; and an assembly body fitted on the circumferential edges of the main body and the oxygen nozzle body, thereby forming a coolant flow space, the assembly body being connected to the burning chamber.

The main body may include an extension, which extends horizontally and radially outwardly substantially from the lower end of the main body to a predetermined extent and has at least one groove formed on the circumferential surface; a first flange positioned above the extension, the first flange extending horizontally and radially outwardly from the main body to an extent larger than that of the extension; and a second flange positioned above the first flange, the second flange extending horizontally and radially outwardly from the main body to an extent larger than that of the first flange, and wherein the at least one semiconductor waste gas supply passage extends substantially vertically through the main body, the at least one fuel supply passage extends vertically through the main body so that the outlet of the fuel supply passage is formed between the extension and the first flange, and the at least one oxygen supply passage extends vertically through the main body, so that the outlet of the oxygen supply passage is formed between the first and second flanges.

The groove formed on the main body may be inclined in such a manner that the virtual extension line of the lower end thereof crosses the central axis of the main body, and wherein the main body is in close contact with the fuel nozzle body, so that the groove form a fuel nozzle, and the fuel nozzle body is in close contact with the extension and the first flange, so that a fuel space is formed between the main body and the fuel nozzle body.

The fuel nozzle body may include a central hole formed through the central part of the fuel nozzle body, into which hole the main body is fitted, and an extension formed around the lower end of the circumferential surface of the fuel nozzle body and radially extending to a predetermined extent, wherein at least one groove is formed on the circumferential surface of the extension.

At least one groove formed on the extension of the fuel nozzle body may be inclined in an angle larger than that of the groove formed on the extension of the main body, the fuel nozzle body is in close contact with the oxygen nozzle body, so that the at least one groove on the extension of the fuel nozzle body forms at least one oxygen nozzle, and the oxygen nozzle body is in close contact with the second flange of the main body and the at least one groove of the fuel nozzle body, so that one or more oxygen spaces are formed between the first and second flange and between the fuel nozzle body and the oxygen nozzle body.

The oxygen nozzle body may include a central hole formed through the central part of the oxygen nozzle body, into which hole the fuel nozzle body is fitted, and an extension formed around the lower end of the circumferential surface of the oxygen nozzle body and radially outwardly extending to a predetermined extent.

The assembly body may include a central hole formed through the central part of the assembly body, into which hole the oxygen nozzle body is fitted, and a coolant flow space is formed between the outer circumferential surface of the oxygen nozzle body and the inner circumferential surface of the assembly body, a coolant pipe being connected to the coolant flow space.

The main body may have an inverted conical surface, the vertex of which forms the lower end of the main body, and a blocking wall extending downward by a predetermined length around the conical surface.

The burning chamber may include a top cover, into the center of which the burner is fitted; an inner chamber depending from the bottom side of the top cover around the burner; and an outer chamber depending from the bottom side of the top cover around the inner chamber.

A cooling tube may be provided in a space between the top cover and the outer chamber for supplying coolant, and at least one through-hole is formed in the cooling tube, so that the coolant is injected into the space between the inner chamber and the outer chamber.

The inner chamber may consist of an upper inner chamber and a lower inner chamber, which are detachable from each other, and the outer chamber also consists of an upper outer chamber and a lower outer chamber, which are detachable from each other.

The burning chamber may include a pilot burner positioned at the lower end of the burner through the outer chamber and the lower chamber to implement initial ignition, and a UV sensor positioned at the lower end of the burner through the outer chamber and the inner chamber to detect whether the initial ignition is successfully implemented.

The burning chamber further may include a particle removing gas supply section, which supplies a gas of predetermined pressure, so that particles do not accumulate on the inner wall of the burning chamber.

The particle removing gas supply section may include a gas supply tube joined to the outside of the top cover of the burning chamber; a gas tube connected to the gas supply tube, the gas tube being formed in a ring shape along the space between the top cover and the inner chamber; and at least one gas nozzle joined to the gas tube and extending by a predetermined length within the inner chamber.

The gas nozzle may include a straight part extending parallel to the inner wall of the burning chamber, and a curved bending toward the inner wall of the burning chamber from the end of the straight part, so that the gas could supply impulse to the inner wall of the inner chamber.

There may be provided four gas nozzles, which are arranged centering on the center of the inner chamber and spaced from each other in an angular space of 90 degrees.

The gas nozzles may be inclined with reference to the vertical direction of the inner chamber, so that the gas can be supplied in a swirl form within the inner chamber.

The gas supplied through the particle removing gas supply section may be an inert gas.

The gas supplied through the particle removing gas supply section may be supplied in a pulsed form.

A substantially funnel-shaped lower chamber may be detachably attached to the lower part of the outer chamber of the burning chamber, and a particle guide member is incorporated in the inside of the lower chamber, the guide chamber being substantially funnel-shaped toward the lower end of the lower chamber so as to guide the particles produced after the burning of waste gas to the wet tower and the water tank.

The particle guide member further may include an inert gas tube for injecting inert gas so as to prevent vapor, which is produced in the water reservoir tank, from being introduced into the burning chamber.

The lower chamber may be provided with a chamber support section for supporting the burning chamber and allowing the burning member to be separated.

The chamber support section may include a pair of guide rails linearly installed on a support plate; a pair of guide blocks mounted on the guide rails 1420 so as to be capable of reciprocating in the horizontal direction; a pair of support dies mounted on the guide blocks and extending upward by a predetermined distance, each of the support dies having a horizontal surface formed at the top portion thereof and a descent surface extending downward from the horizontal surface in a predetermined angle; and one or more support rods for interconnecting the support dies, the lower chamber being provided with rollers, which are mounted to be slidable along the horizontal surfaces or the descent surfaces of the support dies.

The wet tower may include a cylindrical base tower having base injection nozzles; a cylindrical first tower removably mounted on the top of the base tower, a first filter and first nozzles being provided within the first tower; a cylindrical second tower removably mounted on the top of the first tower, a second filter and second nozzles being provided within the second tower; a cylindrical third tower removably mounted on the top of the second tower, a third filter and third nozzles being provided within the third tower; and a cylindrical fourth tower removably mounted on the top of the third tower, plural impact plates and a gas supply pipe being provided within the fourth tower, wherein the first tower and the second tower can be assembled in varying order and the third tower and fourth tower can be also assembled in varying order.

The first tower and the second tower may be identical with each other in height and diameter, and the third tower and the fourth tower are identical with each other in height and diameter, and the diameter of the first and second towers is different from that of the third and fourth towers.

The porosities of the first filter, the second filter, and the third filter may decrease in the order of the first filter, the second filter and the third filter.

A fresh water may be supplied through the base injection nozzles, and water purified from the water reservoir tank is supplied through the first, second and third injection nozzles.

A top-opened cover may be fitted on the top of the fourth tower, a first exhaust tube having a pressure sensing port, a temperature sensing port and a cool air supply port is connected to the cover, and a second exhaust tube is connected to the top end of the first exhaust tube, the second exhaust gas having a exhaust amount control member, so that the exhaust amount can be controlled.

The base tower may be connected to the burning chamber and the water reservoir tank through an intermediate connection tube and a lower connection tube, and the base injection nozzles are arranged in such a manner as to be capable of injecting water upward toward the first filter installed in the first tower.

The base tower further may include a pressure sensing port so as to sense the pressure within the base tower.

The first injection nozzles of the first tower may be arranged above the first filter in such a manner as to be capable of injecting water downward toward the first filter.

The first tower further may include a transparent first window, which is formed in the wall of the first tower, so that the first filter within the first tower can be visually seen.

The second injection nozzles of the second tower may be arranged above the second filter in such a manner as to be capable of injecting water downward toward the second filter.

The second tower further may be include a transparent second window, which is formed in the wall of the second tower, so that the second filter within the first tower can be visually seen.

The third injection nozzles of the third tower may be arranged above the third filter in such a manner as to be capable of injecting water downward toward the third filter.

The impact plates of the fourth tower may be each formed with plural through-holes and are stacked to be vertically spaced from each other, the through-holes formed in adjacent two impact plates are staggered from each other, and the gas supply pipe is arranged above the impact plates in such a manner as to be capable of supplying inert gas downward toward the impact plates.

The water reservoir tank may include a first region assembled under the burning chamber and the wet tower so as to capture water and particles which have dropped from the burning chamber and the wet tower, a second region separated from the first region by a partition and supplied with particle-filtered water from the first region, and a filtration section interposed between the first and second regions so as to filter particles from the water.

A drain pump may be additionally connected to the first region for discharging the water and particles to the outside in unison.

The drain pump may have fluid inlet and outlet ports so as to suction and discharge water and particles, and air inlet and outlet ports for supplying pneumatic pressure to the drain pump so as to operate the drain pump, at least one bubbler being connected to the air outlet port via a pipe and sinking to a predetermined depth in the water of the first region of the water reservoir tank.

The drain pump may be a pneumatic diaphragm pump.

The bubbler may be a noise reducer for reducing noise from the drain pump.

The bubbler may generate bubbles in the water contained in the water reservoir tank each time air is discharged from the drain pump, so that the particles captured in water continuously float in the water without depositing or accumulating on the bottom of the water reservoir tank.

The inlet port of a circulation pump may be connected to the second region of the water reservoir tank, and the outlet port of the circulation pump is connected to the wet tower through a heat exchanger.

BRIEF DESCRIPTION OF THE DRAWINGS

The above and other objects, features and advantages of the present invention will be more apparent from the following detailed description taken in conjunction with the accompanying drawings, in which:

FIG. 7b is an enlarged view of the 7b part in FIG. 7a, and FIG. 7c is an enlarged view of the 7c part in FIG. 7a;

DETAILED DESCRIPTION OF THE INVENTION

Figure 1:
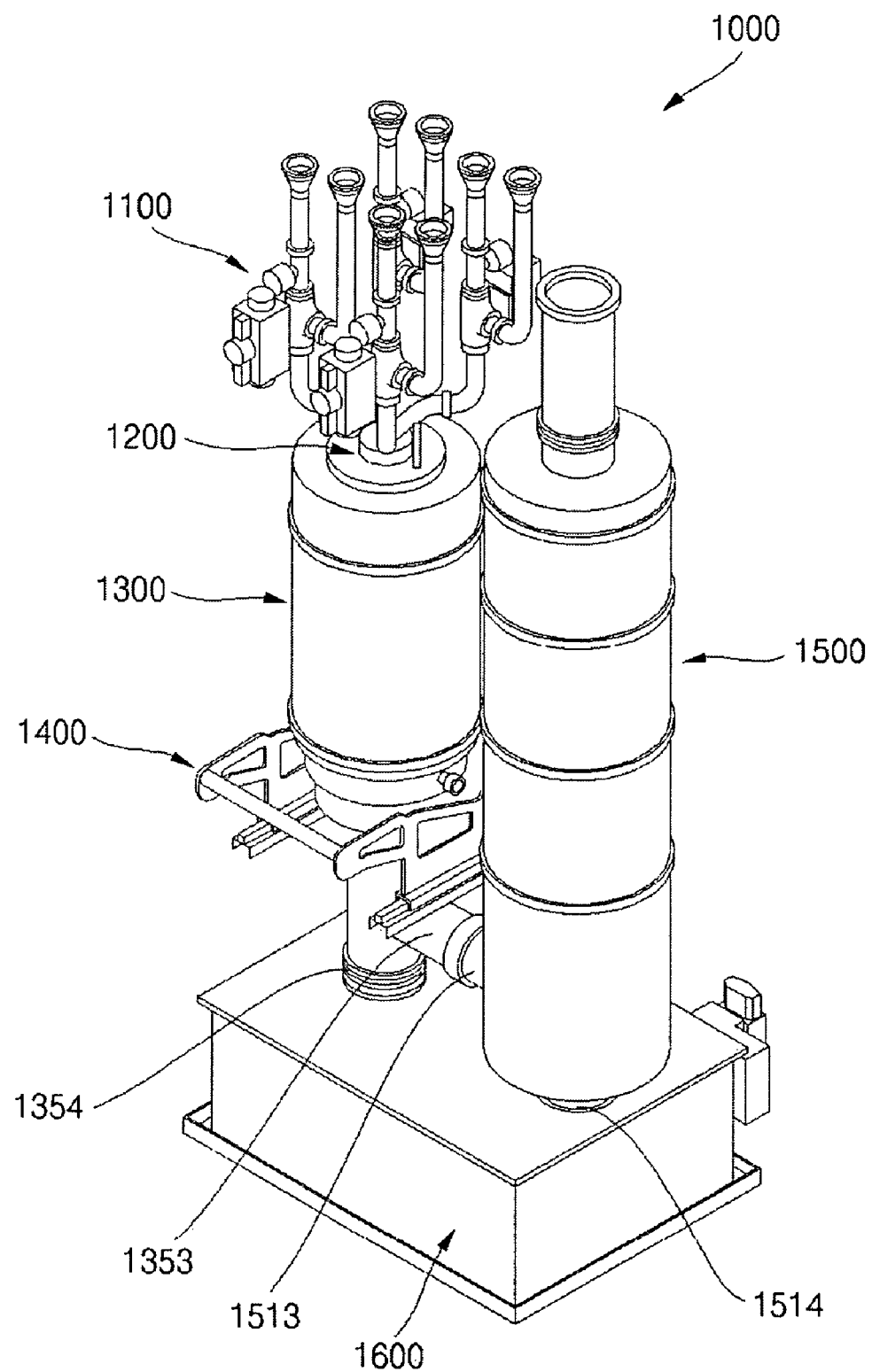
FIG. 1 is a perspective view showing a main construction of the inventive semiconductor waste gas processing scrubber.

Hereinafter, a preferred embodiment of the present invention will be described with reference to the accompanying drawings. In the following description and drawings, the same reference numerals are used to designate the same or similar components, so that repeated description on the same or similar components will be omitted.

FIG. 1 is a perspective view showing a main construction of the inventive semiconductor waste gas processing scrubber 1000.

As shown, the inventive semiconductor waste gas processing scrubber 1000 includes: a supply section 1100 for supplying a semiconductor waste gas, fuel and oxygen, a burner 1200 connected to the supply section 1100 so as to burn the semiconductor waste gas with a flame; a burning chamber 1300 connected to the burner 1200 so as to cause particles or the like, that are produced as the semiconductor waste gas is burnt, to drop; a chamber support section 1400 provided under the burning chamber 1300 so as to support the burning chamber 1300; a wet tower 1500 installed at a side of the burning chamber 1300 so as to discharge filtered gas to the atmosphere while simultaneously with adsorbing and causing the particles or the like transferred from the burning chamber 1300 to drop using water; and a water reservoir tank 1600 joined to the burning chamber 1300 and the wet tower 1500 so as to capture and discharge particles or the like dropping from the burning chamber 1300 and the wet tower 1500, using the water contained therein.

Here, the burning chamber 1300 and the wet tower 1500 may be interconnected via intermediate connection tubes 1353 and 1513. In addition, the burning chamber 1300 and the water reservoir tank 1600 may be interconnected through the intermediate connection tube 1353 and a lower connection tube 1354, and the wet tower 1500 and the water reservoir tank 1600 may be interconnected through another lower connection tube 1514.

Figure 2A:
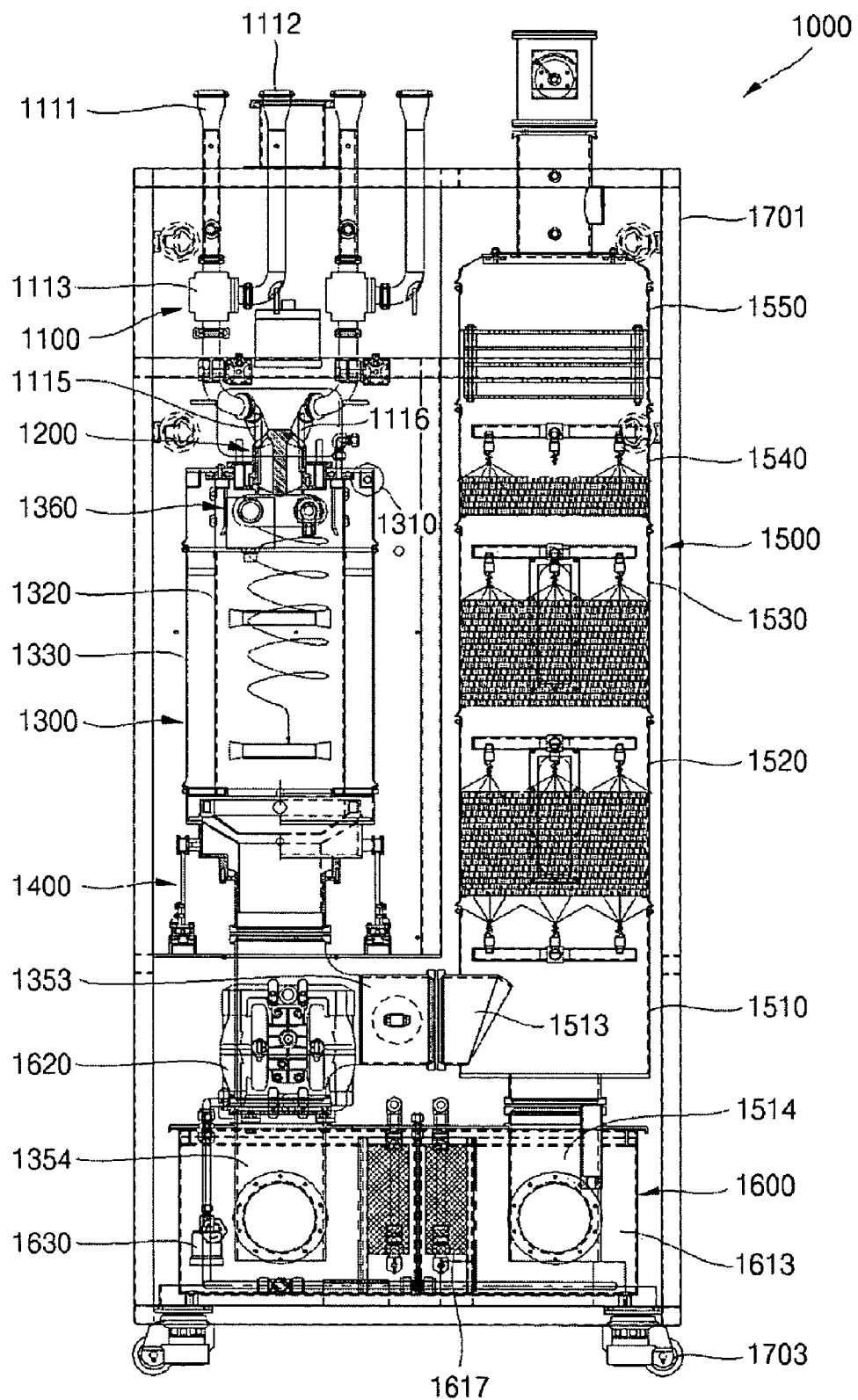
FIGS. 2a to 2c are front, left and right side views showing the inventive semiconductor waste gas processing scrubber in section.
Figure 2B:
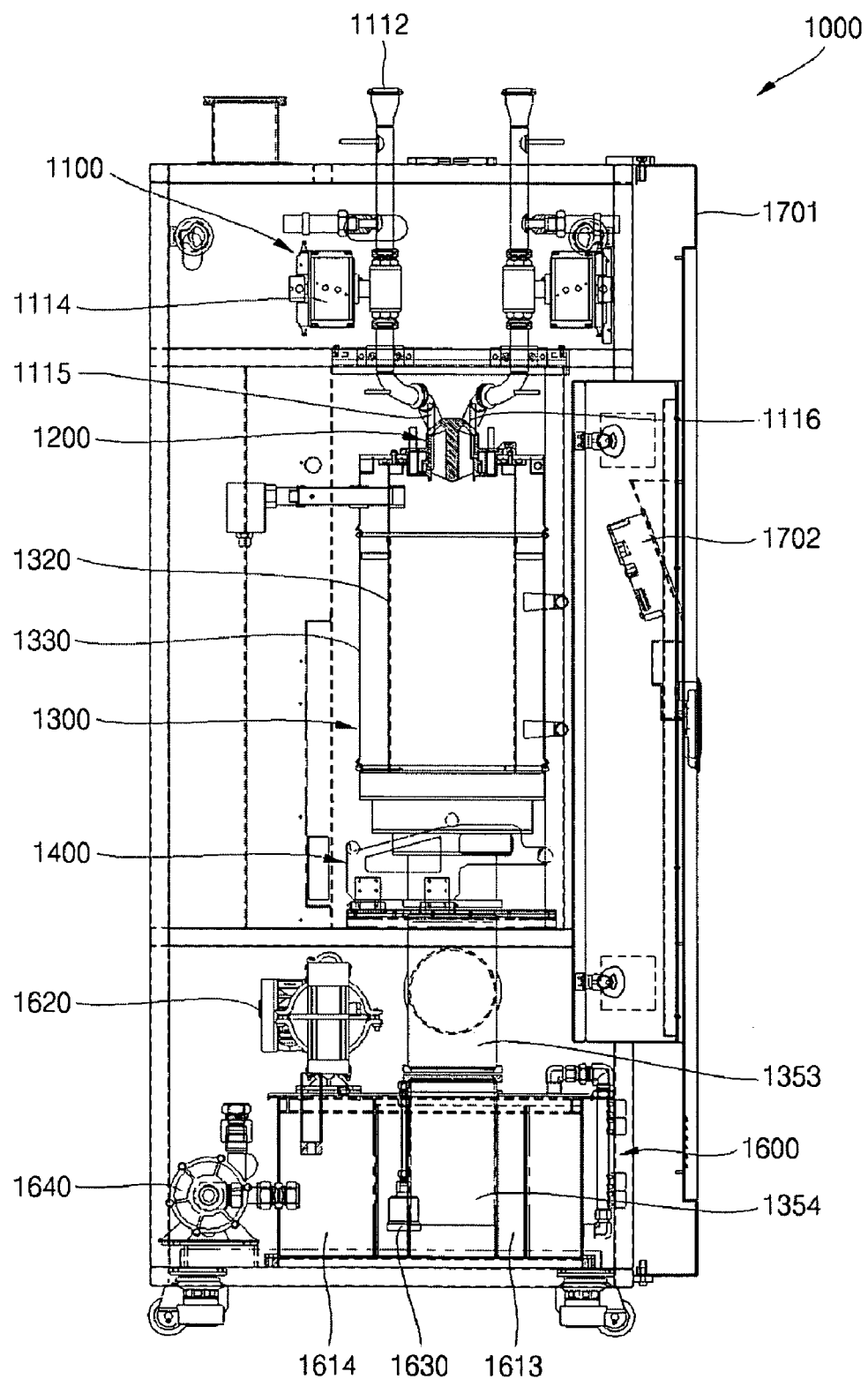
Figure 2C:
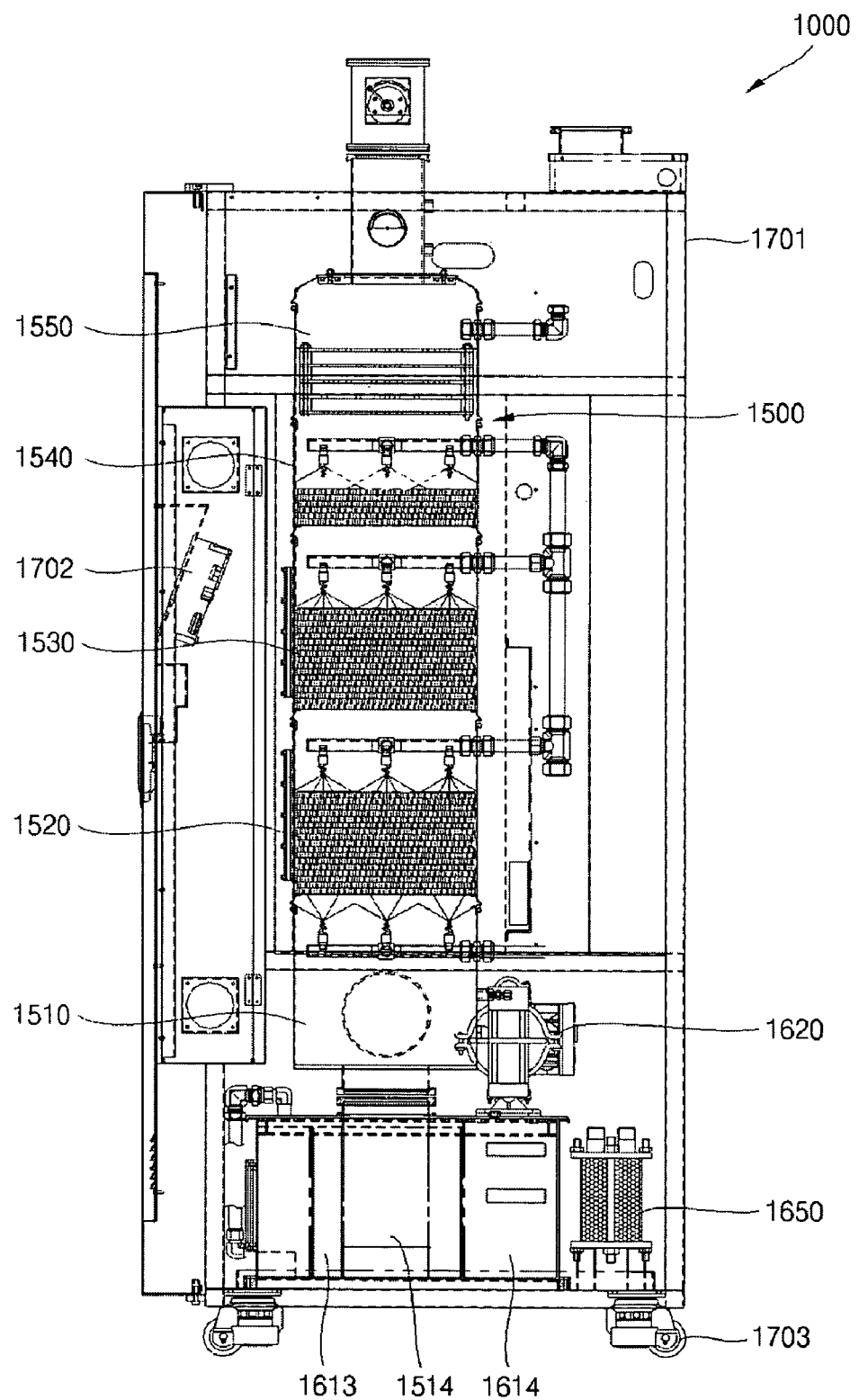

FIGS. 2a to 2c are front, left and right side showing the inventive semiconductor waste gas processing scrubber 1000 in section.

As shown, the supply section 1100 serves to supply a semiconductor waste gas, fuel and oxygen to the burner 1200. Such a supply section 1100 includes a plurality of waste gas supply tubes 1111, a plurality of by-pass waste gas supply tubes 1112, at least one fuel supply tube 1115, and at least one oxygen supply tube 1112. In the drawings, reference numeral 1113 denotes a three-way valve, and 1114 denotes a sensor unit. The supply section 1100 will be described in more detail below.

The burner 1200 serves to properly mix a semiconductor waste gas, fuel and oxygen, which are supplied from the supply section 1100 and at the same time to generate a flame, thereby burning the waste gas so that particles are produced. Such a burner 1200 includes a main body (not shown), through which the semiconductor gas, fuel and oxygen pass, a fuel nozzle body (not shown), which serves as a fuel supply nozzle, an oxygen nozzle body (not shown), which serves as an oxygen supply nozzle, and an assembly body (not shown) which contains a coolant and allows the burner 1200 to be fixed to the burning chamber 1300. Such a burner 1200 will be described in more detail below.

The burning chamber 1300 prevents the heat of the burner 1200 from flowing out to the outside, and directs the particles, remaining gas or the like that are produced by the burner to the wet tower 1500 positioned at a side of the burning chamber 1300 or the water reservoir tank positioned under the burning chamber 1300. Such a burning chamber 1300 includes: a top cover 1310, to the central portion of which the burner 1200 is coupled; an inner chamber 1320 which extends downward from the bottom side of the top cover 1310 and the circumferential edge of the burner 1200 by a predetermined length; and an external chamber 1330 which extends from the bottom of the top cover 1310 by a predetermined length and surrounds the outer circumferential edge of the inner chamber 1320. In addition, a particle removing gas supply section 1360 for supplying gas for removing particles is also provided within the burning chamber 1300, so as to prevent the particles produced from the flame of the burner 1200 from depositing on the inner wall. The burning chamber 1300 and the particle removing gas supply section 1360 will be described in more detail below.

The chamber support section 1400 is installed under the burning chamber 1300 and serves to upwardly support the burning chamber 1300 under the burning chamber 1300. As will be described below, upon moving the chamber support section 1400 laterally, the burning chamber 1300 can be easily removed. This will be described in more detail below.

The wet tower 1500 serves to filter and capture the particles or the like transferred from the burning chamber 1300 using water, to send them to the water reservoir tank 1600 positioned below the wet tower 1500, and to discharge filtered clean gas to the outside. Such a wet tower 1500 includes a base tower 1510, a first tower 1520, a second tower 1530, a third tower 1540, and a fourth tower 1550. Such a wet tower 1500 will be also described in more detail below.

Here, the burning chamber 1300 and the wet tower 1500 are interconnected by the intermediate connection tubes 1353 and 1513 as described above. In addition, the burning chamber 1300 is connected to the water reservoir tank 1600 positioned below the burning chamber 1300 through the intermediate connection tube 1353 and the lower connection tube 1354. Furthermore, the wet tower 1500 is connected to the water reservoir tank through the lower connection tube 1514.

The water reservoir tank 1600 serves to capture particles or the like dropping from the burning chamber 1300 and the wet tower 1500, using water. In addition, the water reservoir tank 1600 serves to discharge the captured particles to the outside or to purify and send the water to the wet tower 1500. Such a water reservoir tank 1600 includes a first region 1613 connected to the burning chamber 1300 and the wet tower 1500, a second region 1614 for receiving only clean water by separating the particles from the first region 1613 (see FIG. 2*b*), and a filtration section 1617 interposed between the first region 1613 and the second region 1614 to filter the water. Here, the first region 1613 is provided with a bubbler 1630 for producing air bubbles every predetermined time period so as to prevent particles from accumulating. In addition, there is also provided a drain pump 1620 so as to operate the bubbler 1630 as well as to discharge the particles and water from the first region 1613. Furthermore, the second region 1614 is provided with a circulation pump 1640 for suctioning and sending water filtered by the second area 1614 to the wet tower 1500 (see FIG. 2*b*), and a heat exchanger 1650 for cooling the water (see FIG. 2*c*). Such a water reservoir tank 1600 will be also described in more detail below.

In the drawings, reference numeral 1701 denotes a case which forms the outer appearance of the inventive scrubber 1000, 1702 denotes an operating panel, and 1703 denotes casters.

Figure 3:
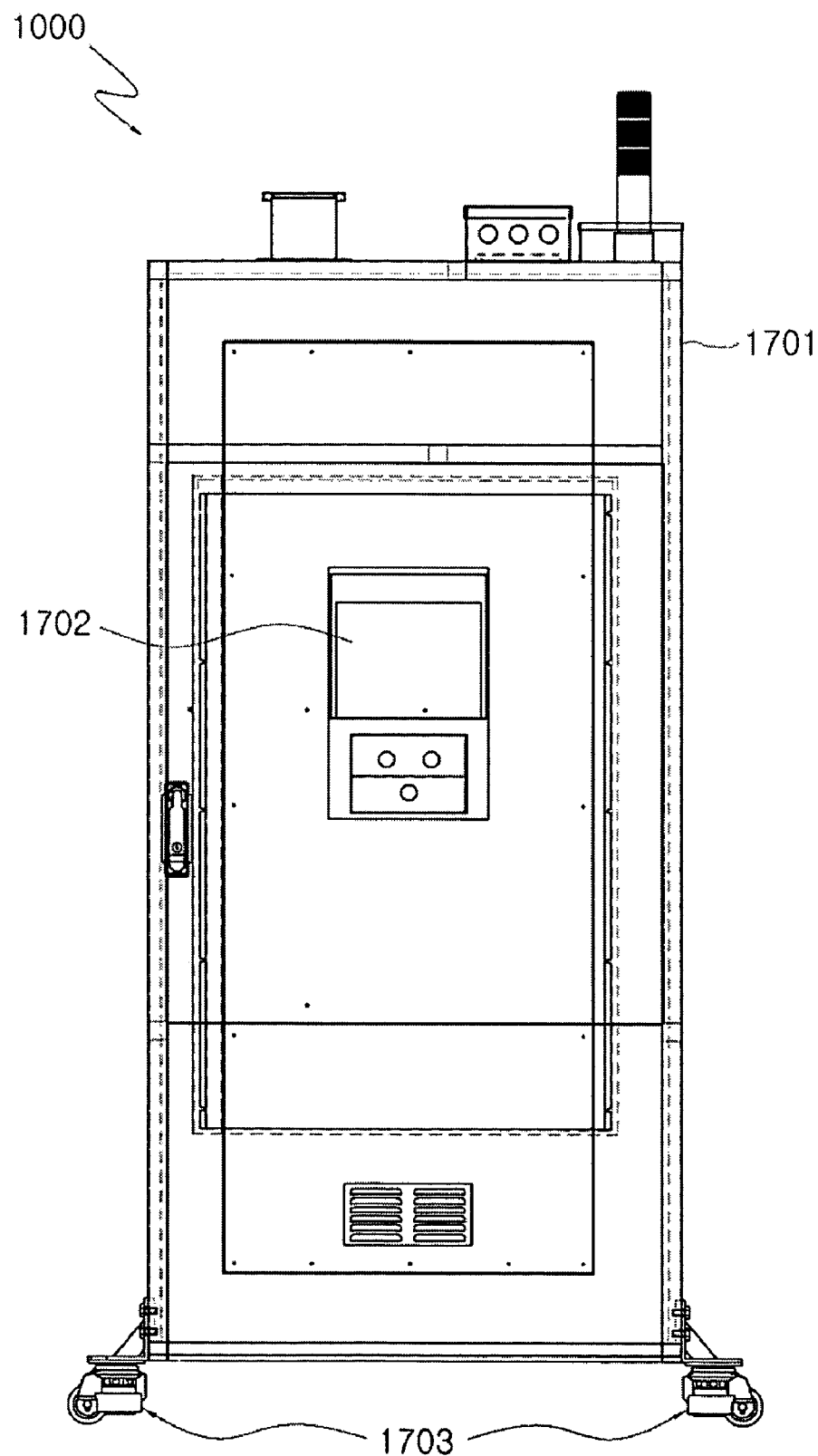
FIG. 3 is a front view showing the outer appearance of the inventive semiconductor waste gas processing scrubber.

FIG. 3 is a front elevational view showing the outer appearance of the inventive semiconductor waste gas processing scrubber 1000.

The above-mentioned supply section, burner, burning chamber, chamber support section, wet tower, and water reservoir tank can be all installed within a substantially square-shaped case 1701. In addition, the operating panel 1702 may be provided in front of the case 1701 so as to control respective components. Furthermore, a plurality of casters 1703 may be mounted under the case 1701.

Figure 4:
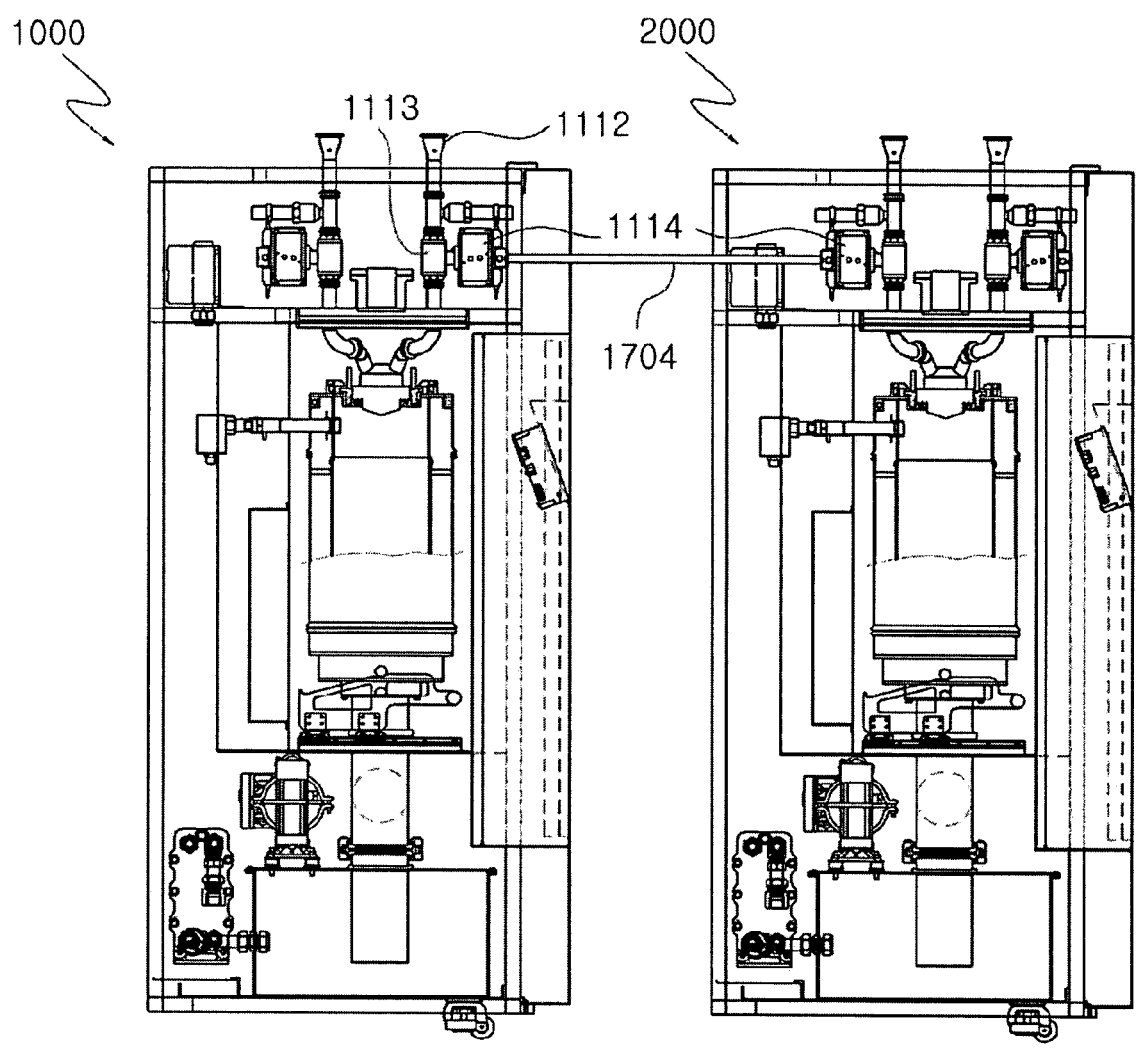
FIG. 4 is a left side view showing an interconnected state of the inventive semiconductor waste gas processing scrubbers in section.

FIG. 4 is a left side sectional view showing the interconnected states of the inventive semiconductor waste gas processing scrubbers 1000 and 2000.

As shown, the inventive semiconductor waste gas processing scrubbers 1000 and 2000 may be connected with each other. Namely, a sensor unit 1114, which is provided in one scrubber 1000, may be connected with a sensor unit 1114, which is provided in the other scrubber 2000, via a connection tube 1704. Therefore, if the semiconductor waste gas is not smoothly supplied to the one scrubber 1000, the corresponding sensor unit 1114 senses this and causes the waste gas to be delivered to the other scrubber 2000 through the connection tube 1704. In the drawing, reference numeral 1112 denotes semiconductor waste gas supply tubes and 1113 denotes three-way valves.

Figure 5A:
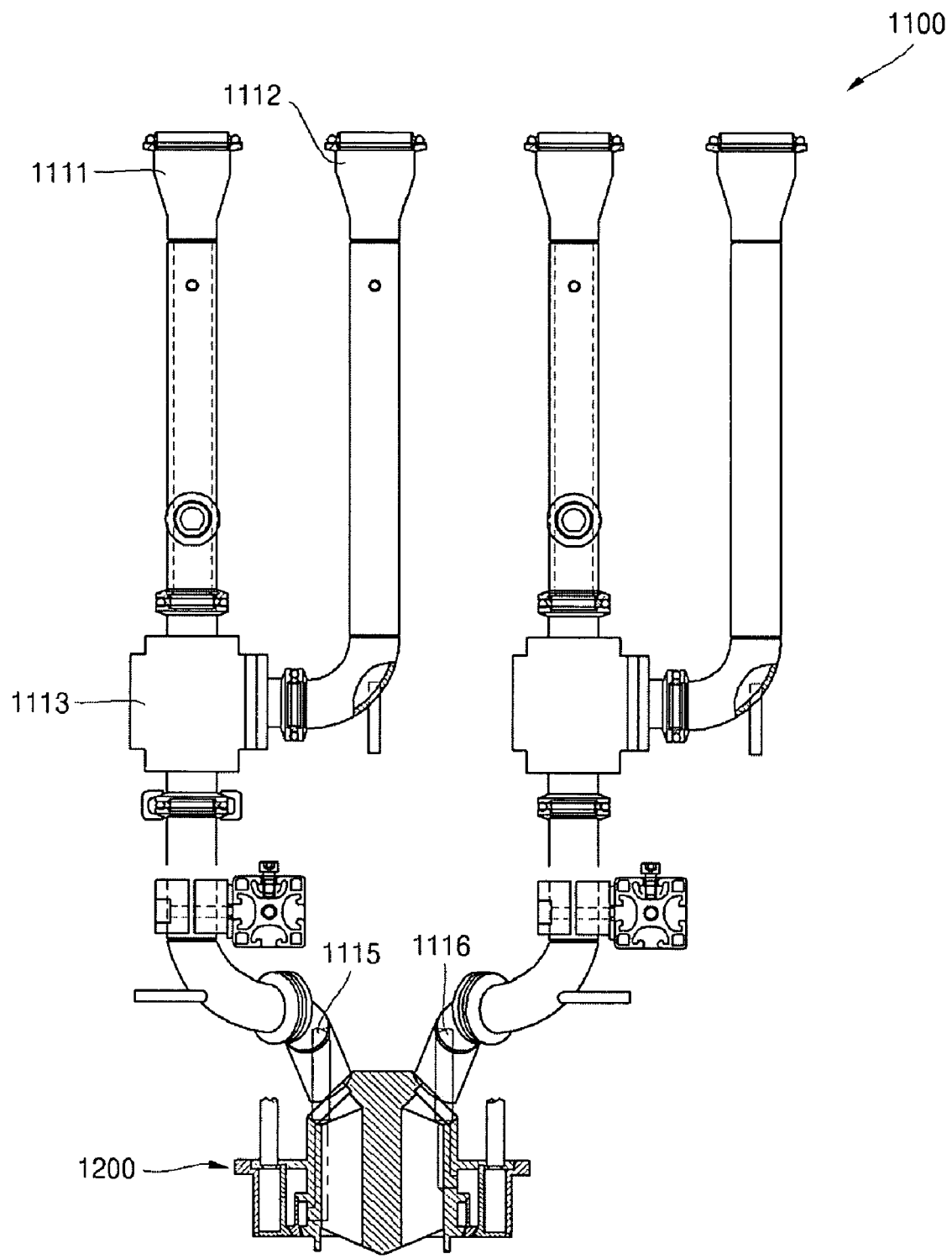
FIGS. 5a and 5b are front and left side views showing a supply section of the inventive semiconductor waste gas processing scrubber in section.
Figure 5B:
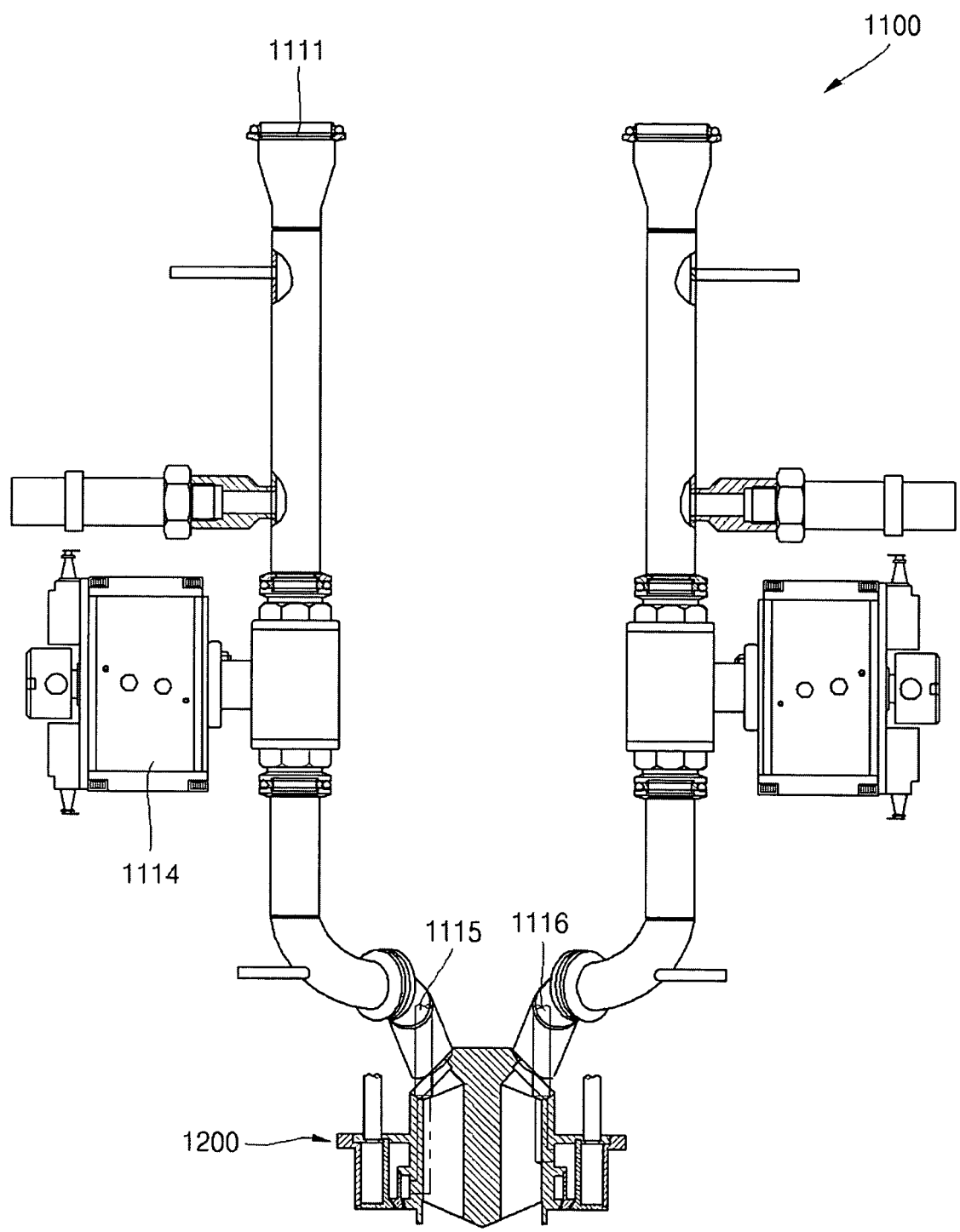

FIGS. 5*a* and 5*b* are front and left side view showing the supply section 1100 of the inventive semiconductor waste gas processing scrubber 1000 in section.

As shown, the supply section 1100 includes waste gas supply tubes 1111, bypass waste gas supply tubes 1112, a fuel supply tube 1115, an oxygen supply tube 1116, three way valves 1113, and sensor units 1114. The waste gas supply tubes 1111 are connected to the burner 1200 so as to supply semiconductor waste gas to the burner 1200. The bypass waste gas supply tubes 1112 are connected to the waste gas supply tubes 1111, respectively, so as to send the waste gas overflowing from the waste gas supply tubes 1111 to another equipment or scrubber. The fuel supply tube 1115 is connected to the burner 1200 so as to supply fuel, such as LNG, LPG, etc., to the burner 1200. The oxygen supply tube 1116 is connected to the burner 1200, so as to supply, for example, air to the burner 1200. The three-way valves 1113 are interconnected between the waste gas supply tubes 1111 and the bypass waste gas supply tubes 1112, thereby determining the direction for supplying waste gas. In addition, the sensor units 1114 sense the quantity of waste gas supplied as described above, and determine whether to transfer the waste gas to the other scrubber.

Figure 6A:
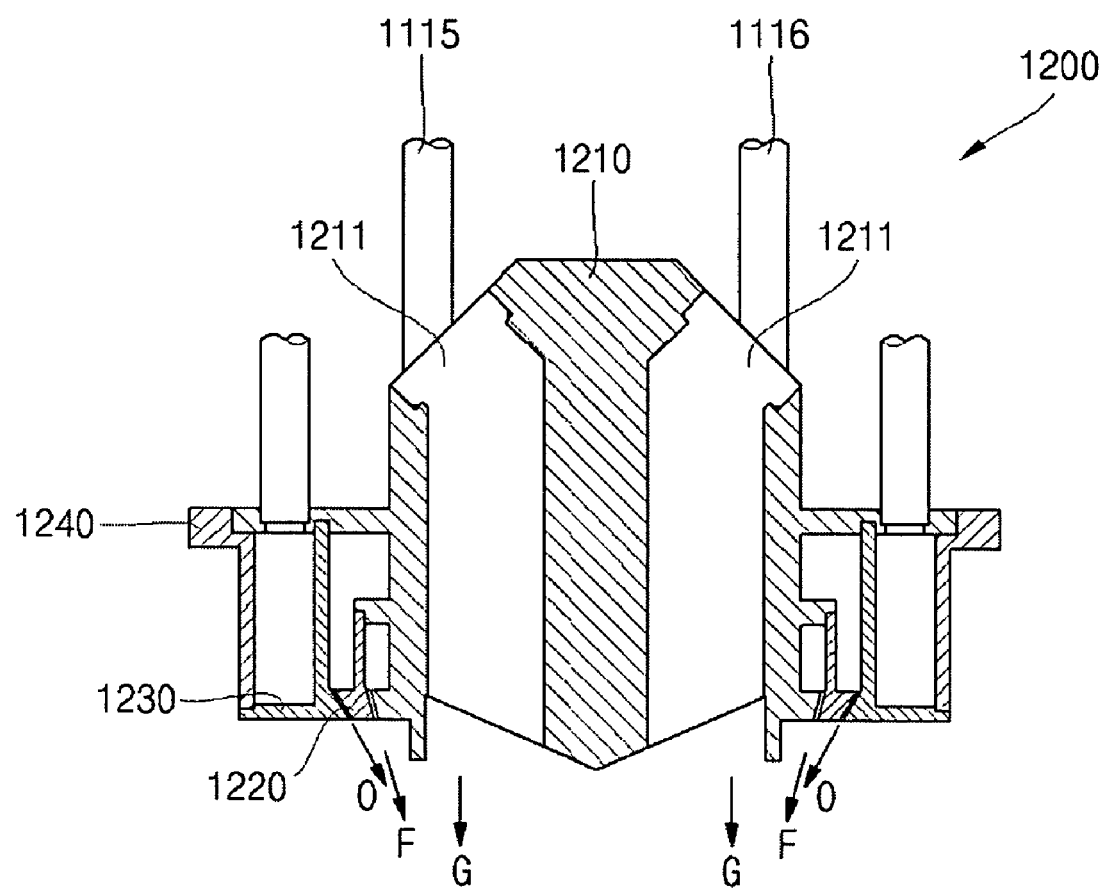
FIGS. 6a and 6b are front views showing the burner of the inventive semiconductor waste gas processing scrubber differently in section.
Figure 6B:
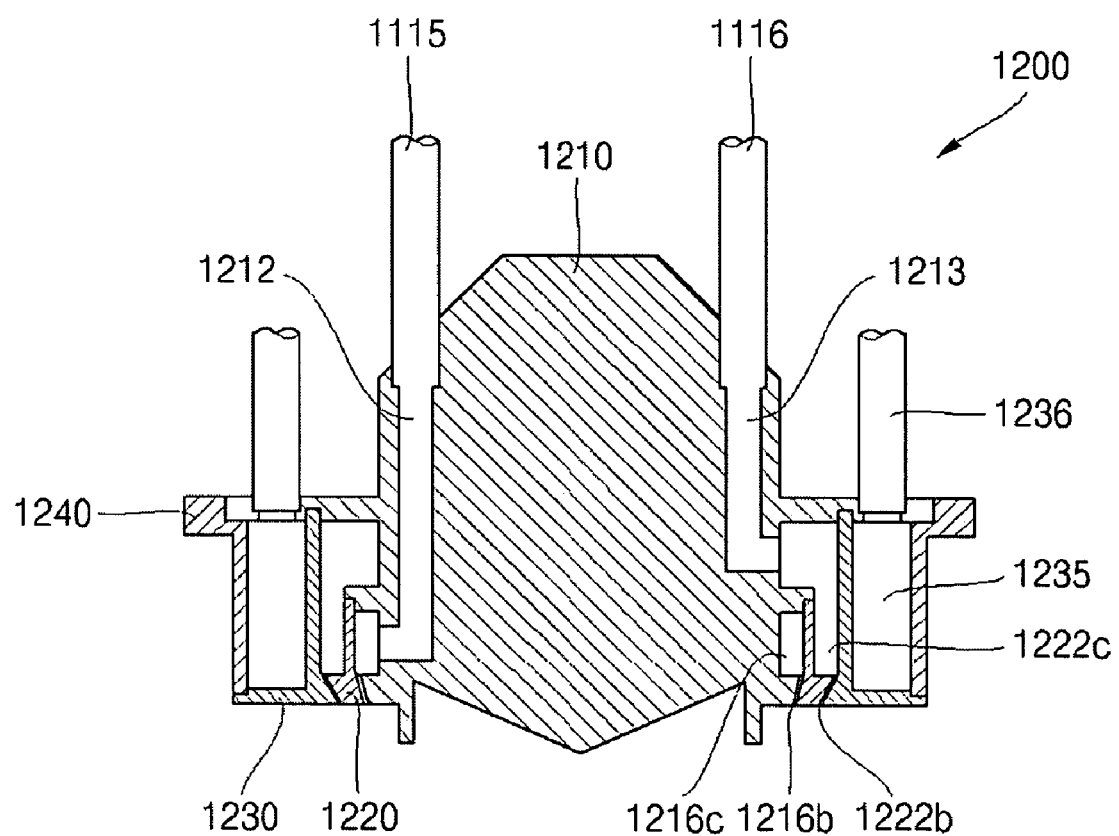

FIGS. 6*a* and 6*b* are different front sectional view showing the burner 1200 of the inventive semiconductor waste gas processing scrubber 1000.

Figure 7A:
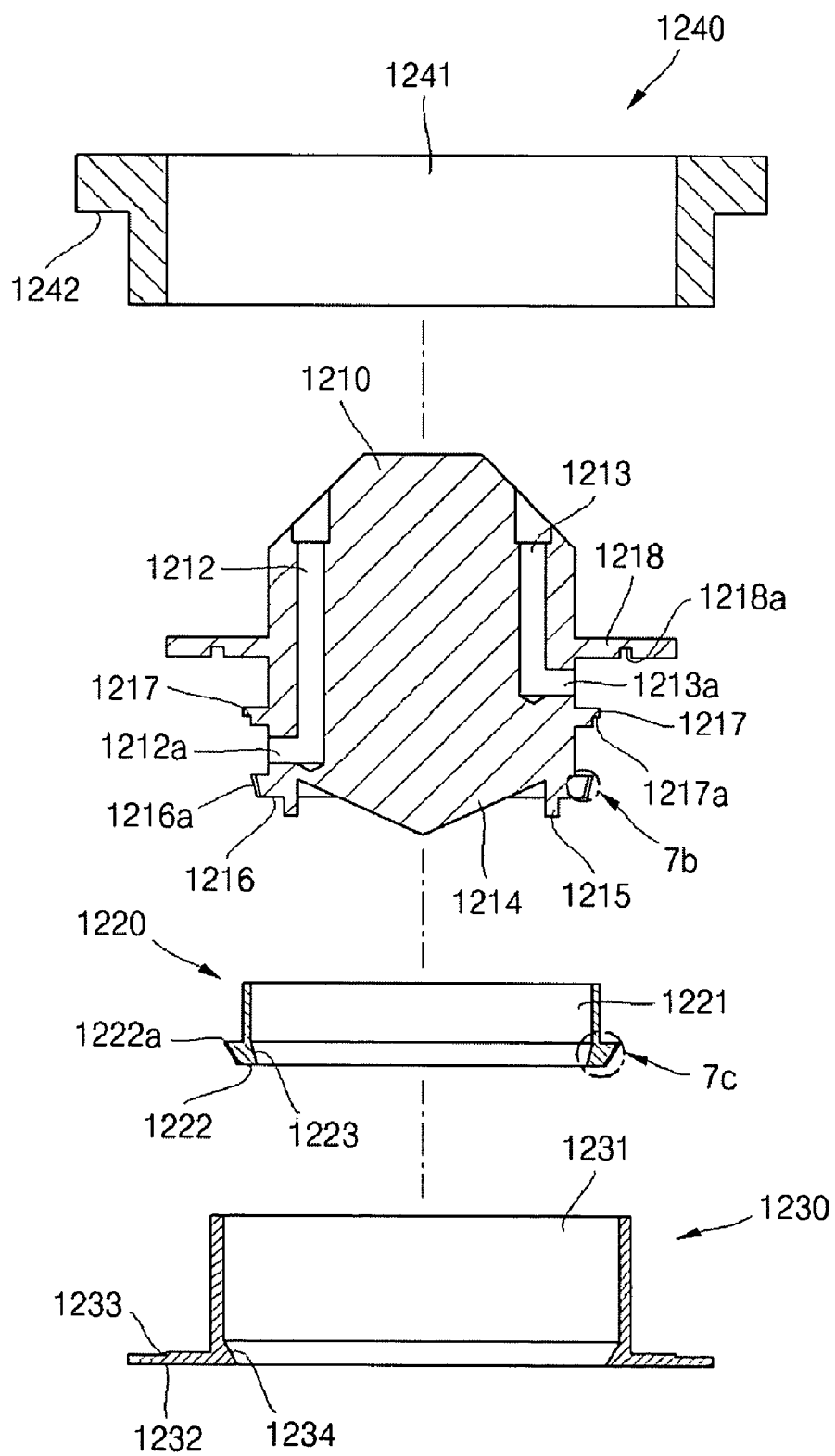
FIG. 7a is an exploded cross-sectional view of the burner of the inventive semiconductor waste gas processing scrubber.
Figure 7B:
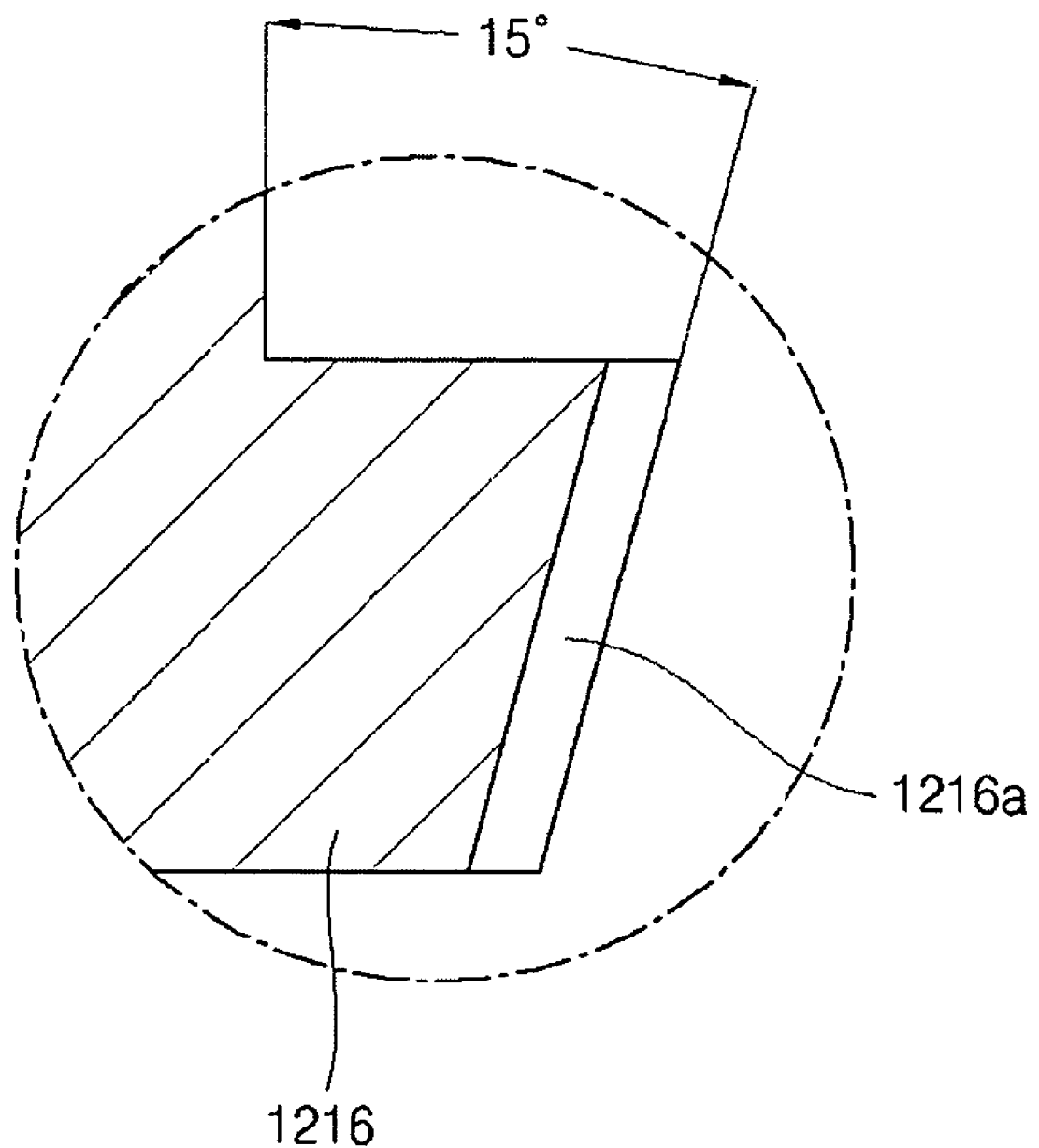
Figure 7C:
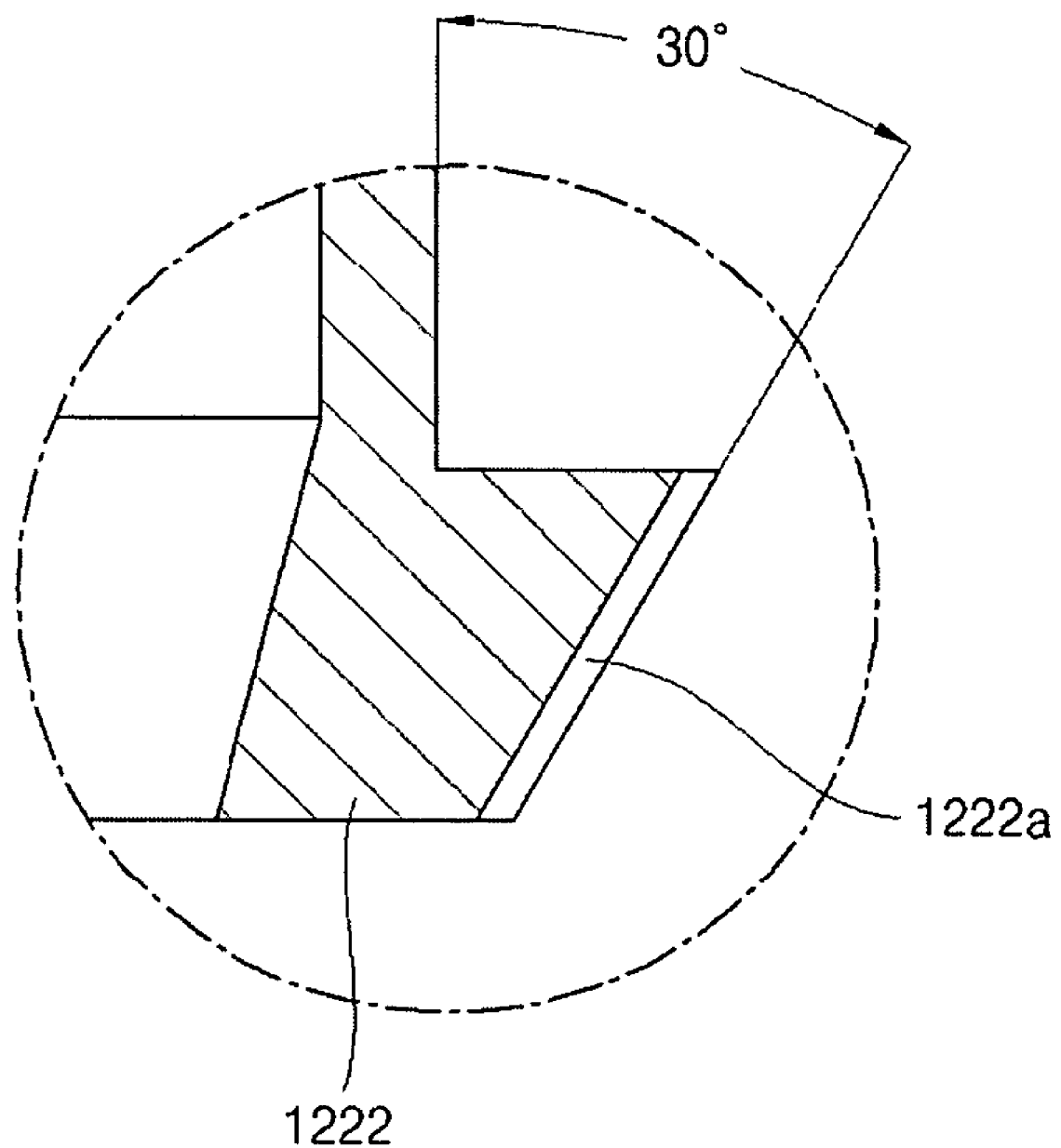

In addition, FIG. 7*a* is an exploded cross-sectional view of the burner 1200 of the inventive semiconductor waste gas processing scrubber 1000, FIG. 7*b* is an enlarged view of the 7*b* part in FIG. 7*a*, and FIG. 7*c* is an enlarged view of the 7*c* part in FIG. 7*a*.

Figure 8:
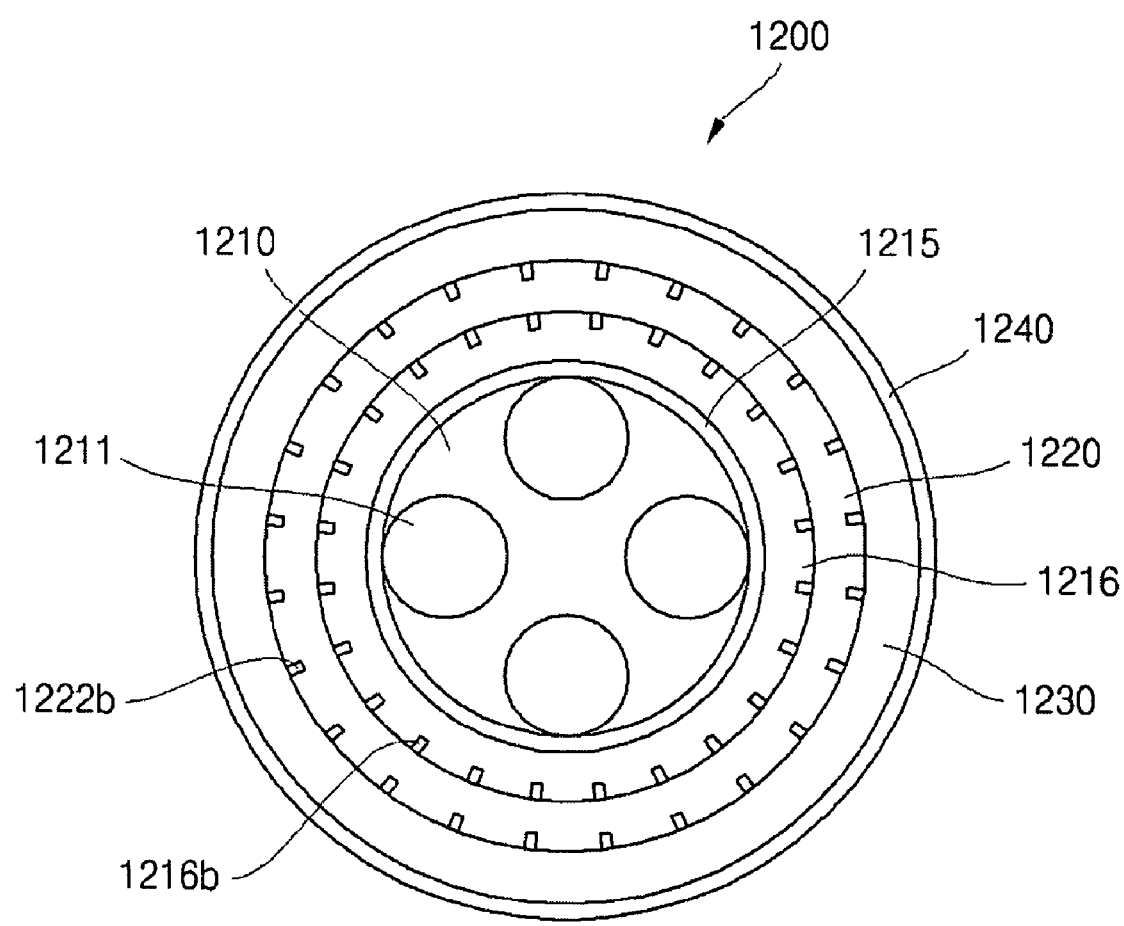
FIG. 8 is a bottom view of the burner of the inventive semiconductor waste gas processing scrubber.

Further, FIG. 8 is a bottom view of the burner 1200 of the inventive semiconductor waste gas processing scrubber 1000.

At first, as shown in FIGS. 6a and 6b, the burner 1200 includes a main body 1210, a fuel nozzle body 1220, an oxygen nozzle body 1230, and an assembly body 1240.

The main body 1210 is formed with at least one waste gas supply passage 1112 which is connected to a semiconductor waste gas supply tube (not shown), wherein the waste gas supply passage 1112 is formed so as to extend through the main body 1210 from the top end to the bottom end so that the semiconductor waste gas is supplied through the supply passage. In addition, the main body 1210 is formed with a fuel supply passage 1212 for supplying fuel, which is connected to the fuel supply tube 1115 of the supply section 1100, wherein the fuel supply passage 1212 extends downwardly from the top of the main body 1200 through the main body 1200 and then bends toward a side of the main body 1200, where the outlet of the fuel supply passage is formed. Furthermore, the main body 1210 is formed with an oxygen supply passage 1213 which is connected to the oxygen supply tube 1116 of the supply section 1100, wherein the oxygen supply passage 1213 extends downwardly from the top of the main body 1210 and then bends to an opposite side portion of the main body 1210 in relation to the fuel supply passage, the outlet of the oxygen supply passage 1213 being formed at the opposite side. In FIG. 6a, G denotes waste gas supplied through the waste gas supply passage 1211, F denotes fuel supplied through the fuel supply passage 1212, and O denotes oxygen supplied through the oxygen supply passage 1213.

Next, referring to FIG. 7a, the main body 1210 is formed with an inverted conical surface 1214, the vertex of which protrudes downward from the main body 1210, and a blocking wall 1215 is formed around the conical surface 1214 in such a manner as to extend by a predetermined length. In addition, an extension 1216 is also formed around and radially outwardly extends from the outer circumferential edge of the blocking wall 1215 in such a manner as to have a predetermined horizontal length, wherein the extension 1216 is formed with one or more grooves 1216a (see FIG. 7b) on the outer circumferential surface thereof. Above the extension 1216, a first flange 1217 with a step portion 1217a is also formed around and radially outwardly extends from the outer circumferential surface of the main body 1210 in such a manner as to have a horizontal length which is larger than that of the extension 1216. Above the first flange 1217, a second flange 1218 is also formed around and radially outwardly extends from the outer circumferential surface of the main body 1210 in such a manner as to have a horizontal length which is larger than that of the first flange 1217, wherein the second flange 1218 is formed with a recess 1281a of a predetermined depth.

Here, the fuel supply passage 1212 extends downwardly through the main body 1210 from the top of the main body 1210 and then bends to a side of the main body 1210, so that the outlet 1212a of the fuel supply passage 1212 is formed between the extension 1216 and the first flange 1217. In addition, the oxygen supply passage 1213 extends downwardly through the main body 1210 from the top of the main body 1210 and bends to a side of the main body 1210, so that the outlet 1213a of the oxygen supply passage 1212 is formed between the first flange 1217 and the second flange 1218.

The grooves 1216a formed on the extension 1216 of the main body 1210 are inclined by a predetermined angle (for example 15 degrees) (see FIG. 7b) so that virtual lines extending from the lower ends thereof intersect the central line of the main body 1210. Furthermore, the extension 1216 comes into close contact with the fuel nozzle body 1220, thereby the grooves 1216a form fuel nozzles 1216b (see FIG. 6b), and the fuel nozzle body 1220 also comes into close contact with the first flange 1217 as well as the extension 1216 (see FIG. 6b), whereby a fuel space 1216c is formed between the main body 1210 and the fuel nozzle body 1220. Here, the top end of the fuel nozzle body 1220 is engaged with the step portion 1217a of the first flange 1217.

As shown in FIG. 7a, the fuel nozzle body 1220 is formed with a central hole 1221 extending through the central part thereof, so that the main body 1210 is fitted into the central hole 1221, and an extension 1222, which is formed around and radially outwardly extends from the lower end of the circumferential surface of the fuel nozzle body 1220 in such a manner as to have a predetermined horizontal length, wherein one or more grooves 1222a are formed on the circumferential surface of the extension 1222. The grooves 1222a (see FIG. 7c) formed on the extension 1222 of the fuel nozzle body 1220 are inclined by an angle (for example 30 degrees), which is larger than the angle of the grooves 1216a formed on the extension 1216 of the main body 1210. In addition, the central hole 1221 of the fuel nozzle body 1220 is formed with an inclined surface 1223, which is adapted to be capable of abutting against the extension 1222 of the main body 1210, thereby to cover grooves 1222a of the main body 1210. As the inclined surface 1223 of the fuel nozzle body 1220 comes into close contact with the extension 1222 of the oxygen nozzle body 1230 (see FIG. 6b), oxygen nozzles 1222b are formed by the grooves 1222a, and as the oxygen nozzle body 1230 comes into close contact with the second flange 1218 of the main body 1210 as well as the extension 1222 of the fuel nozzle body 1220 (see FIG. 6b), an oxygen space 1222c is defined by the first flange 1217, the second flange 1218, the fuel nozzle body 1220, and the oxygen nozzle body 1230. Here, the top end of the oxygen nozzle body 1230 is engaged in the recess 1218a of the second flange 1218.

As shown in FIG. 7a, the oxygen nozzle body 1230 has a central hole 1231, which is formed through the central portion of the oxygen nozzle body 1230, so that the fuel nozzle body 1220 can be fitted into the central hole 1231, and an extension 1232, which is formed around and radially outwardly extends from the lower end of the oxygen nozzle body 1230 in such a manner as to have a predetermined horizontal length, wherein a step portion 1233 is formed on the extension 1232. Here, the central hole 1231 of the oxygen nozzle body 1230 is also formed with an inclined surface 1234, which is adapted to be capable of abutting against the extension 1222 of the fuel nozzle body 1220.

As shown in FIG. 7a, the assembly body 1240 has a central hole 1241, which is formed through the central portion of the assembly body 1240 so that the oxygen nozzle body 1230 can be fitted into the central hole 1241, and an extension 1242 which is formed around and extends radially outwardly from the top end of the assembly body 1240 in such a manner as to have a predetermined horizontal length. As shown in FIG. 6b, the assembly body 1240 is engaged with the step portion 1233 of the oxygen nozzle body 1230 at the lower end thereof, and a coolant flow space 1235 is formed between the oxygen nozzle body 1230 and the assembly body 1240. Of course, a coolant pipe 1236 is connected to the coolant flow space 1235.

Meanwhile, as shown in FIG. 8, the fuel nozzles 1216b are generally arranged in a circular array and each fuel nozzle is shaped substantially in a recess form. In addition, as shown in FIG. 8, the oxygen nozzles 1222b are also generally arranged in a circular array and each oxygen nozzle is shaped substantially in a recess from. Of course, the oxygen nozzles 1222b are positioned on the outside of the fuel nozzles 1216b.

As mentioned above, the fuel nozzles 1216b and the fuel nozzles 1222b are inclined by predetermined angles and substantially oriented toward the center of the lower end of the burner 1200. That is, the inclined angle of the oxygen nozzles 1222b is larger than that of the fuel nozzles 1216b, and oriented toward the central axis of the burner 1200. Therefore, the mixing of the injected fuel and the oxygen, which are injected by the nozzles 1216b and 1222b, can be facilitated in the vicinity of the nozzles 1216b and 1222b, and a funnel-shaped flame can be formed, which are convergent to the center of the lower end of the burner 1200.

In addition, as the blocking wall is formed substantially at the lower end of the burner 1200, it is possible to separate the mixed gas of fuel and oxygen and the semiconductor waste gas. This prevents the dilution of the mixed gas of fuel and oxygen, which is caused as the mixed gas is mixed with the waste gas containing a large quantity of inert gas (nitrogen), thereby allowing the position of flame root to be stably maintained.

Furthermore, according to the inventive burner 1200, an inverted conical surface 1214 is formed at the lower part of the main body 1210 so as to delay the inter-mixing of waste gas streams. This is provided considering the effect of delaying the inter-mixing of waste gas streams from neighboring waste gas supply passages 1211, which can be obtained by spatially varying the positions of outlet ends of respective waste gas supply passages 1211 from each other.

Consequently, as the mixing of fuel and oxygen is certainly accomplished by the funnel-shaped flame, the burner 1200 can be improved in terms of burning efficiency. In addition, as the mixed gas of fuel and oxygen and the waste gas are separated from each other by the blocking wall 1215, which is provided adjacent the flame forming position, the position of flame root can be stably maintained. Furthermore, as the central lower part of the burner 1200 is formed in a funnel shape so as to delay the inter-mixing of waste gas streams, the burning efficiency can be improved.

Figure 9A:
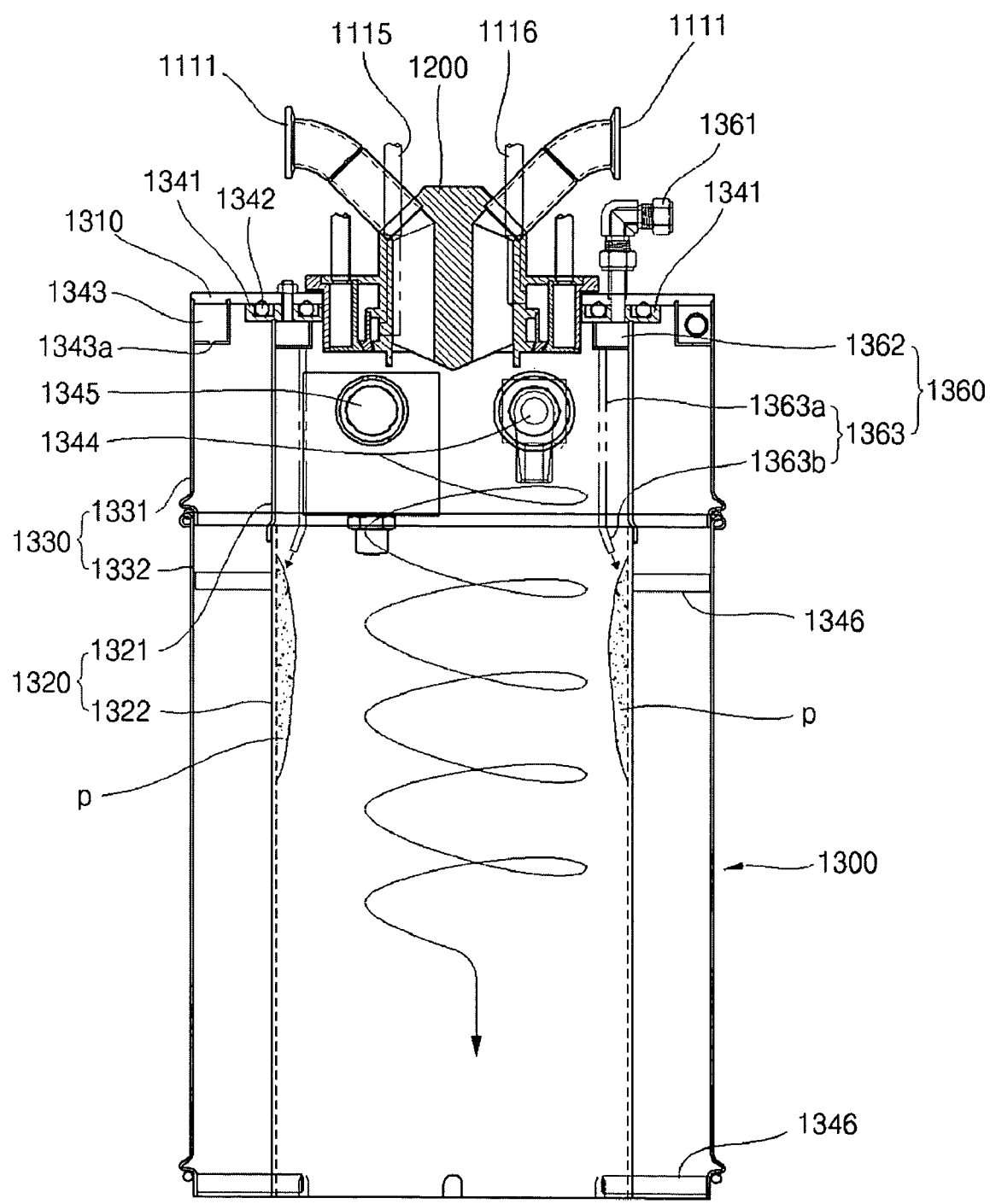
FIGS. 9a to 9c are front, top and bottom views showing the burning chamber of the inventive semiconductor waste gas processing scrubber in section.
Figure 9B:
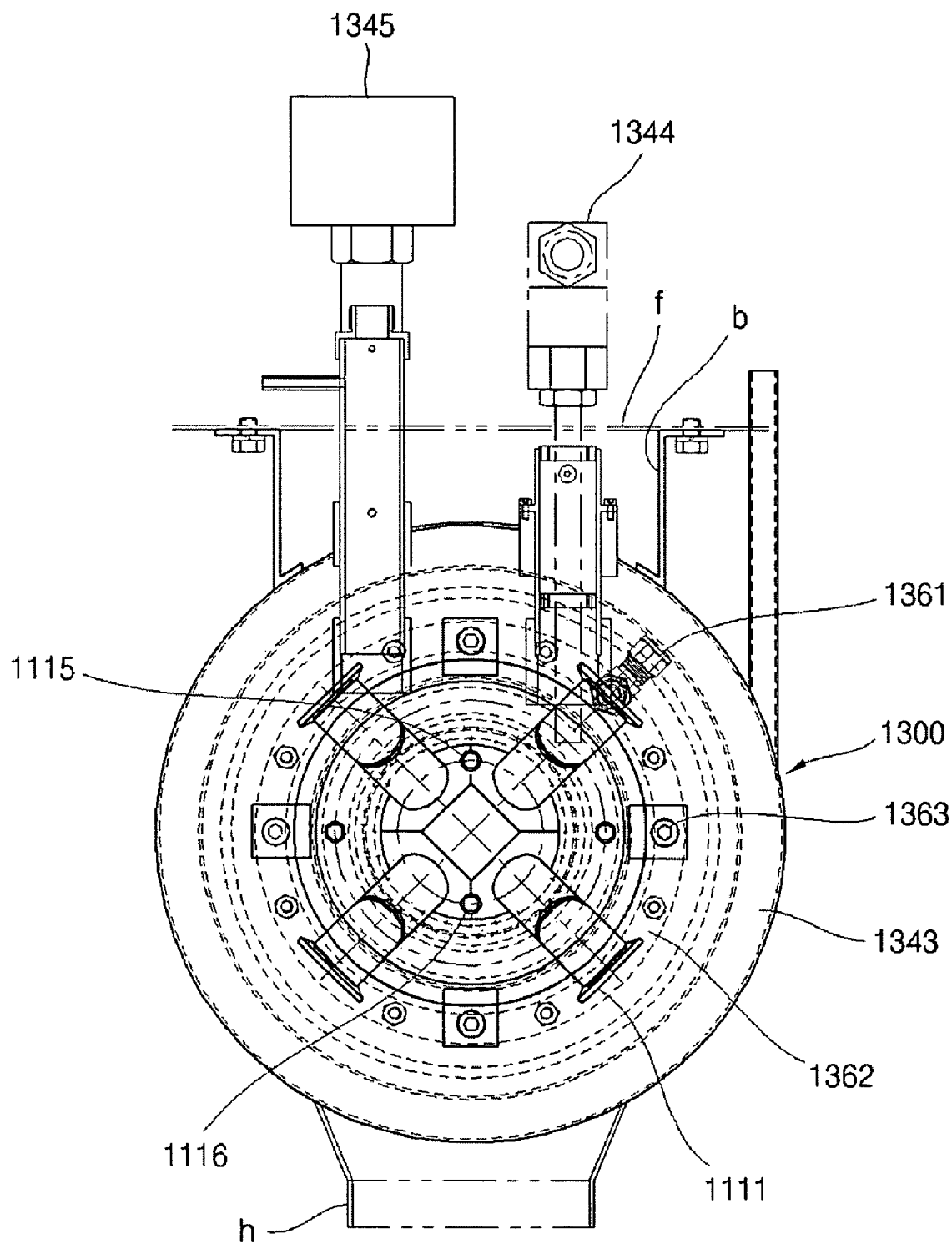
Figure 9C:
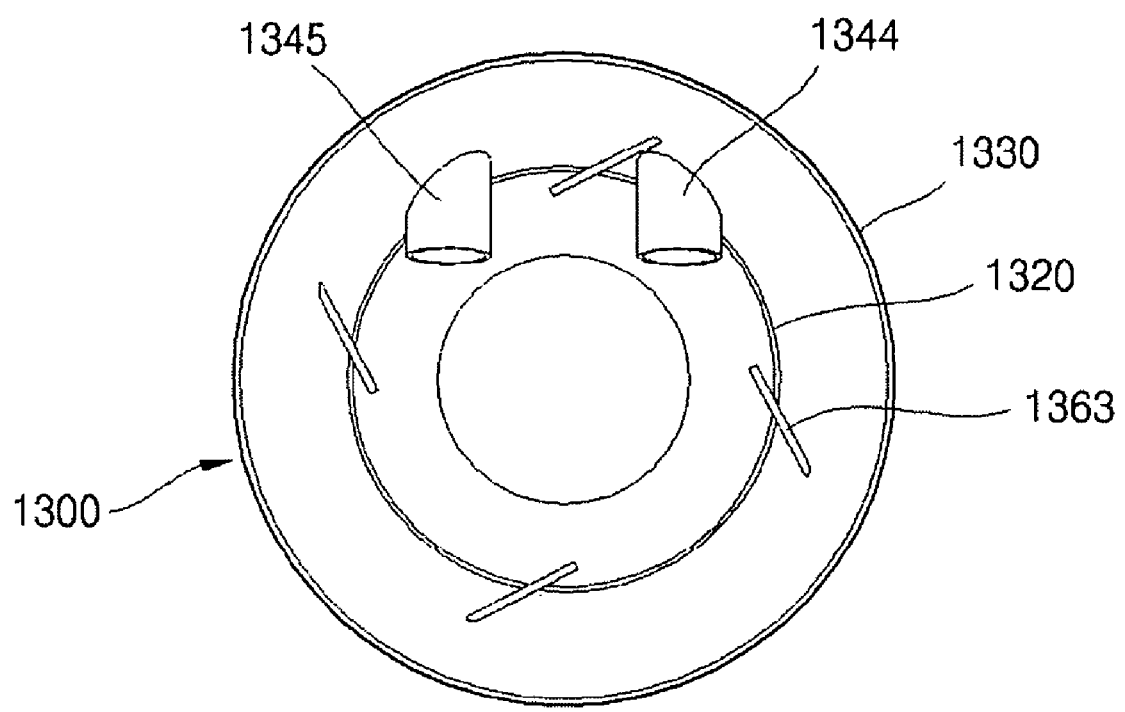

FIGS. 9a to 9c are front, top and bottom side views showing the burning chamber 1300 of the inventive semiconductor waste gas processing scrubber 1000 in section.

As shown, the burning chamber 1300 includes: a top cover 1310, into the center of which the burner 1200 is fitted; an inner chamber 1320 depending from the bottom side of the top cover 1310 around the burner 1200; an outer chamber 1330 depending from the bottom side of the top cover 1310 around the inner chamber 1320, and a lower chamber (not shown) connected to the lower part of the outer chamber 1330. The lower chamber will be described in detail below. The inner chamber 1320 includes an upper inner chamber 1321 and a lower inner chamber 1322. In addition, the outer chamber 1330 also includes an upper outer chamber 1331 and a lower outer chamber 1332. The upper inner chamber 1321 and the lower inner chamber 1332 are detachably engaged with each other. The upper outer chamber 1331 and the lower outer chamber 1332 are also detachably engaged with each other.

The burner 1200 configured as described above is joined substantially to the center of the top cover 1310. In addition, the upper inner chamber 1321 of the inner chamber 1320 is joined to the bottom side of the top cover 1310 around the outer circumferential edge of the burner 1200, and the lower inner chamber 1322 is joined to the lower end of the upper inner chamber 1321. The upper outer chamber 1331 of the outer chamber 1330 is joined to the bottom side of the top cover 1310 around the outer circumferential edge of the inner chamber 1320, and the lower outer chamber 1332 is joined to the lower end of the upper outer chamber 1331. In addition, a plurality of anchoring members 1346 are engaged between the lower inner chamber 1322 and the lower outer chamber 1332, thereby anchoring both chambers to each other. With this construction, the present invention allows the lower inner chamber 1322 and the lower outer chamber 1332 to be easily separated in unison from the upper inner chamber 1321 and upper outer chamber 1331.

Here, a sealing ring 1341 is further interposed between the top cover 1310 and the upper inner chamber 1321 of the inner chamber 1320, wherein at least a rubber ring 1342 is engaged with the inner surface of the sealing ring 1341 and closely contacted with the top cover 1310. The upper inner chamber 1321 is fixed to the top cover 1310 by means of bolts and nuts 1321, the bolts extending through the sealing ring 1341 and the top cover 1310. In addition, a cooling tube 1343 is coupled between the top cover 1310 and the upper outer chamber 1331 of the outer chamber 1330, through which tube coolant is supplied, so that the burning chamber 1300 is not overheated while the burner 1200 is being operated. Of course, the cooling tube 1342 is formed with one or more through-holes 1343a for injecting coolant. Through the upper outer chamber 1331 and the upper inner chamber 1321, a pilot burner 1344 and a UV (ultra-violet) sensor 1321 are installed, respectively. The pilot burner 1344 serves to perform the initial ignition of the burner 1200, and the UV sensor 1345 serves to sense whether the ignition is properly implemented. Of course, if the ignition is confirmed by the UV sensor 1345, the operation of the pilot burner 1344 is stopped. The above-mentioned water reservoir tank 1600 is connected to the lower end of the burning chamber 1300 through a structure, which will be described below.

Meanwhile, the burning chamber 1300 is further provided with a particle removing gas supply section 1360. The particle removing gas supply section 1360 includes a gas supply tube 1361, a gas tube 1362 connected to the gas supply tube 1361, and at least one gas nozzle 1363 connected to the gas tube 1362.

The gas supply tube 1361 is joined to the top cover 1310 of the burning chamber 1300 and extends through the sealing ring 1341 interposed between the top cover 1310 and the upper inner chamber 1321.

In addition, the gas tube 1362 is formed substantially in a square shape in cross-section and interposed between the sealing ring 1341 and the upper inner chamber 1321.

The gas nozzle 1363 connected to the gas tube 1362 extends downward by a predetermined length within the upper inner chamber 1321. More specifically, the gas nozzle 1363 includes a straight part 1363a extending parallel to the inner wall of the burning chamber 1300, and a curved part 1363 bending toward the inner wall of the burning chamber 1300 from the end of the straight part 1363a. It is possible to provide four gas nozzles 1363 arranged substantially centering on the center of the burning chamber 1300 with an angular space of 90 degrees between adjacent two gas nozzles 1363. Of course, the number of the gas nozzles 1363 is merely an example and the present invention is not limited by the number of the gas nozzles 1363. In addition, the gas nozzles 1363 may be provided in a tilted or inclined form in relation to the vertical direction of the burning chamber 1300, so that the gas can be supplied in a swirl form within the burning chamber 1300 (i.e., the upper inner chamber 1321 and the lower inner chamber 1322).

An inert gas, which does not react with a semiconductor waste gas, may be preferably used as the gas, which is supplied to the interior of the inner chamber 1320 through the particle removing gas supply section 1360. More preferably, nitrogen gas, which is most frequently used in a semiconductor fabrication process, can be employed as the gas but the present invention is not limited by such gases.

It is preferable if the gas supplied to the interior of the inner chamber 1320 through the particle removing gas supply section 1360 is supplied substantially in a pulsed form. This is because if the gas is supplied in a pulsed form, the impulse transferred to the inner wall of the inner chamber 1320 is larger than that transferred to the inner wall when the gas is continuously supplied with a fixed flow rate. By the impulse transferred to the inner chamber 1320, the particles, which are about to deposit on or have already deposited on the inner wall of the inner chamber 1320, are separated or removed from the inner wall and freely drop. In FIG. 9a, the particles are denoted by reference symbol P.

More specifically, the pressure of inert gas supplied through the particle removing gas supply section 1360 is preferably in the range of 1 to 10 $kgf/cm^2$. Namely, through the synthetic investigation for the degree of deposition or removal of particles and the stability of the apparatus, which has been performed while changing the pressure of inert gas, it has been found that if the pressure of the inert gas is not more than 1 $kgf/cm^2$, the particles are relatively easy to deposit or difficult to be removed although the stability of the apparatus is most superior, and if the pressure of the inert gas is not less than 10 $kgf/cm^2$, the stability of the apparatus is deteriorated although the particles are difficult to deposit or easy to be removed. Here, the stability of the apparatus means the performance of the apparatus that does not suffer from a phenomenon deteriorating the suctioning efficiency of semiconductor waste gas, fuel, oxygen, etc., which is produced as positive pressure is developed due to the supply of the inert gas. Of course, the interior of the burning chamber 1300 is normally under a negative pressure.

In practice, the gas supplied through the particle removing gas supply section 1360 may be supplied in somewhat different forms depending on the kind and quantity of the semiconductor waste gas, which is introduced into the burning chamber 1300 through the waste gas supply tube 1111 and the burner 1200.

For example, if a waste gas containing a large quantity of silicon is introduced, a large quantity of particles is produced. Therefore, it is advantageous to supply the inert gas in a pulsed form throughout the operation of the burner 1200, so that the particles do not deposit on the inner wall of the inner chamber 1320.

In addition, if a waste gas containing a small quantity of silicon is introduced, a small quantity of particles is produced. Therefore, it is advantageous to intermittently supply the inert gas in a pulsed form only for a predetermined length of time. That is, the particles, which have deposited on the inner wall of the inner chamber 1320, are easily removed even if the inert gas for removing the particles is not supplied throughout the operation of the burner 1200 but supplied only for a length of time with a predetermined time period.

Occasionally, it is also possible to supply inert gas only when particles deposit and accumulate on the inner wall of the burning chamber 1300 more than a predetermined thickness. That is, it is possible to supply inert gas to the burning chamber 1300 for a predetermined length of time only when the pressure of the burning chamber 1300 is under a pressure near the atmospheric pressure, so that the particles, which have deposited on the inner wall, can be removed. Of course, it is possible to install a pressure sensor (not shown) in the inner chamber 1320 so as to sense the pressure of the burning chamber 1300, in particular the inner chamber 1320.

In FIG. 9b, reference symbol "h" denotes a lift handle, which is mounted on the lower outer chamber 1332 so as to allow an operator to draw the lower outer chamber 1332 and the lower inner chamber 1322 in unison to the outside. In addition, reference symbol "f" denotes a frame installed within the waste gas processing apparatus so as to support the burning chamber 1300, and "b" denotes a bracket for joining the burning chamber 1300 to the frame.

Figure 10A:
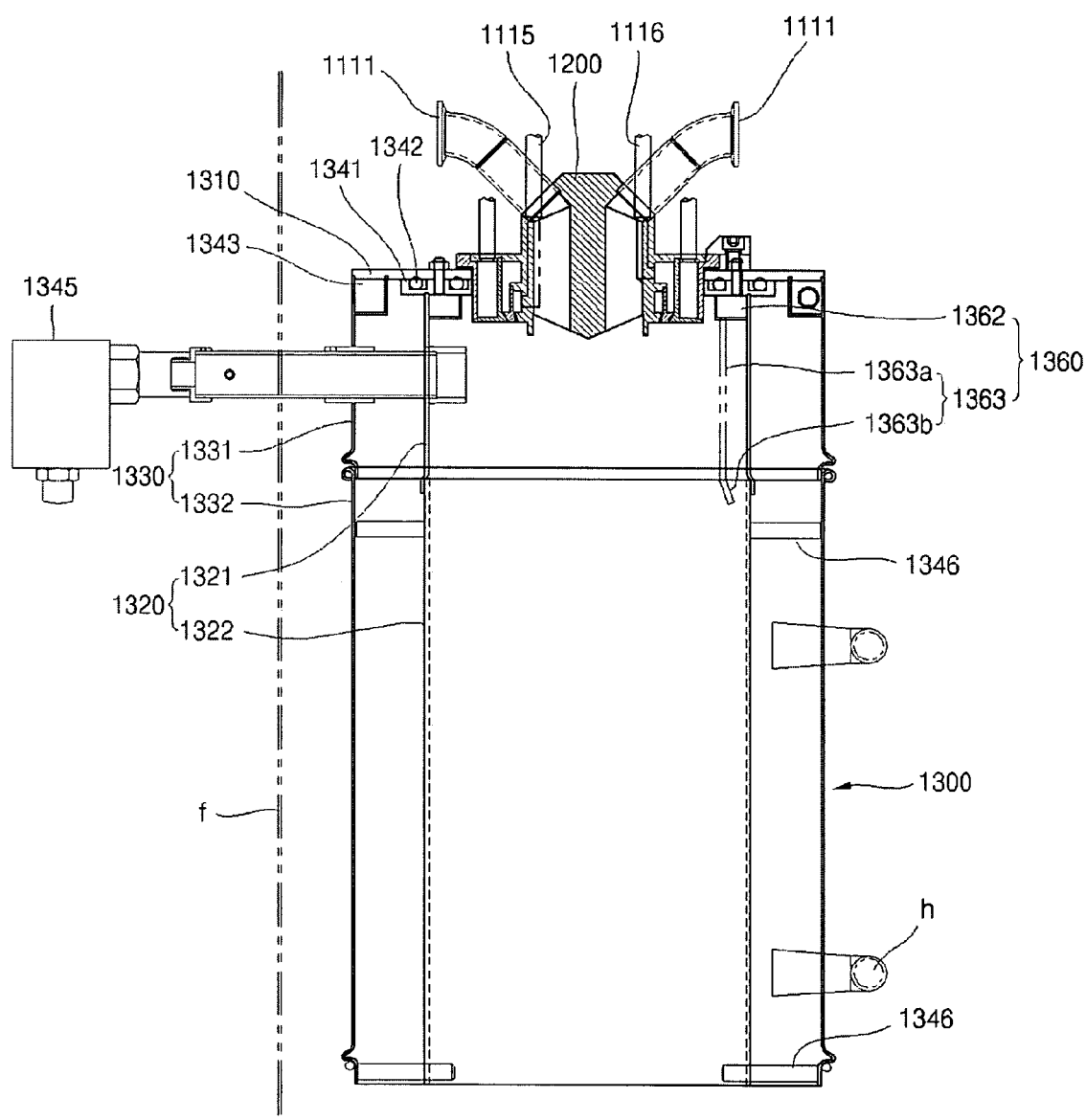
FIGS. 10a and 10b are left and right side views showing the burning chamber of the semiconductor waste gas processing scrubber in section.
Figure 10B:
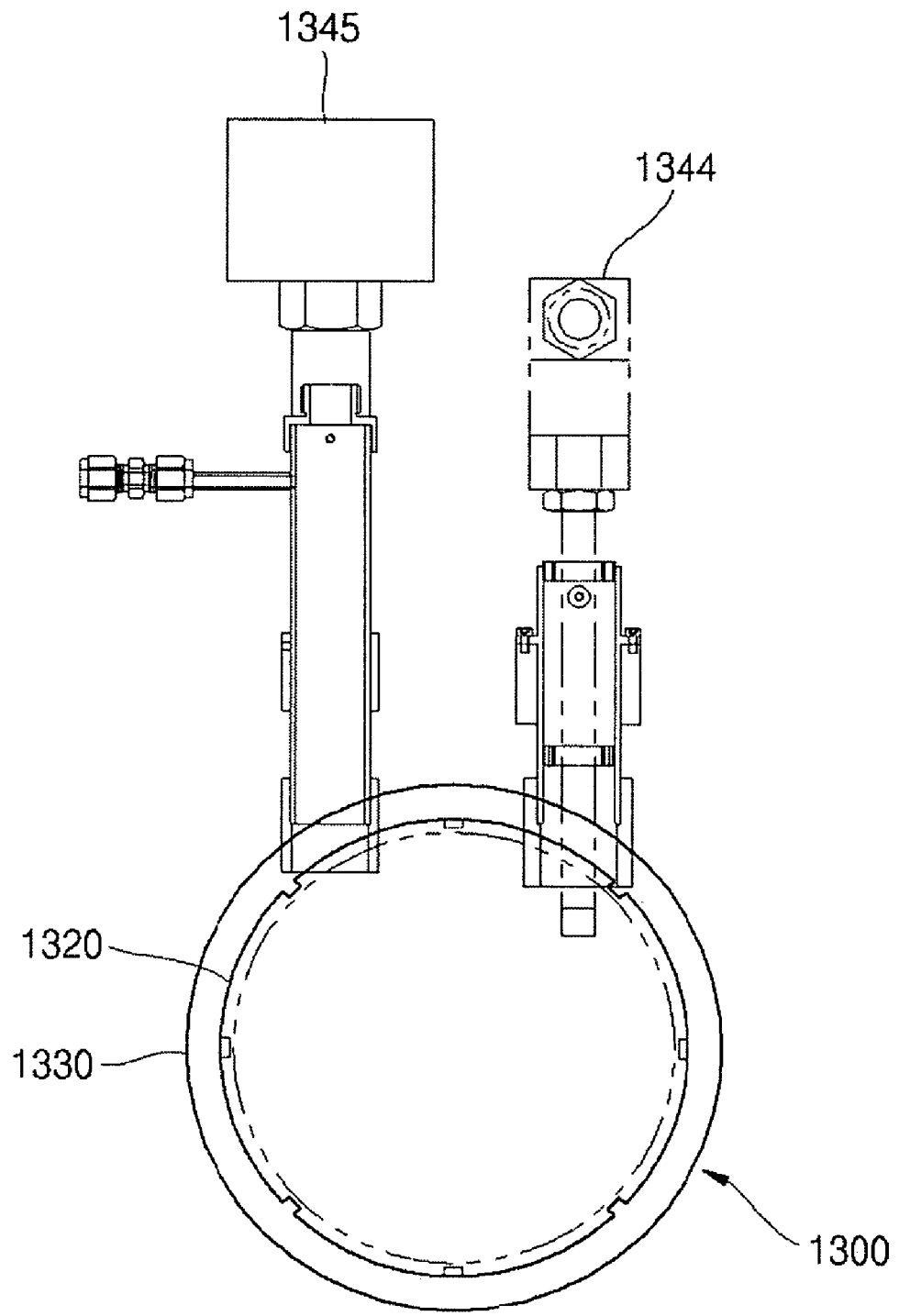

FIGS. 10a and 10b are left and right side views showing the burning chamber 1300 of the semiconductor waste gas processing scrubber 1000 in section.

As shown, according to the present invention, at least one lift handle h is provided on the front side of the lower outer chamber 1332 of the outer chamber 1330, and a pilot burner 1344 and an UV sensor 1345 are provided through the upper outer chamber 1331 and the upper inner chamber 1321. Of course, the burner 1200 is joined substantially to the central part of the top cover 1310. Because the other components have all been described above with reference to FIGS. 9a to 9c, they are not described any further.

Figure 11A:
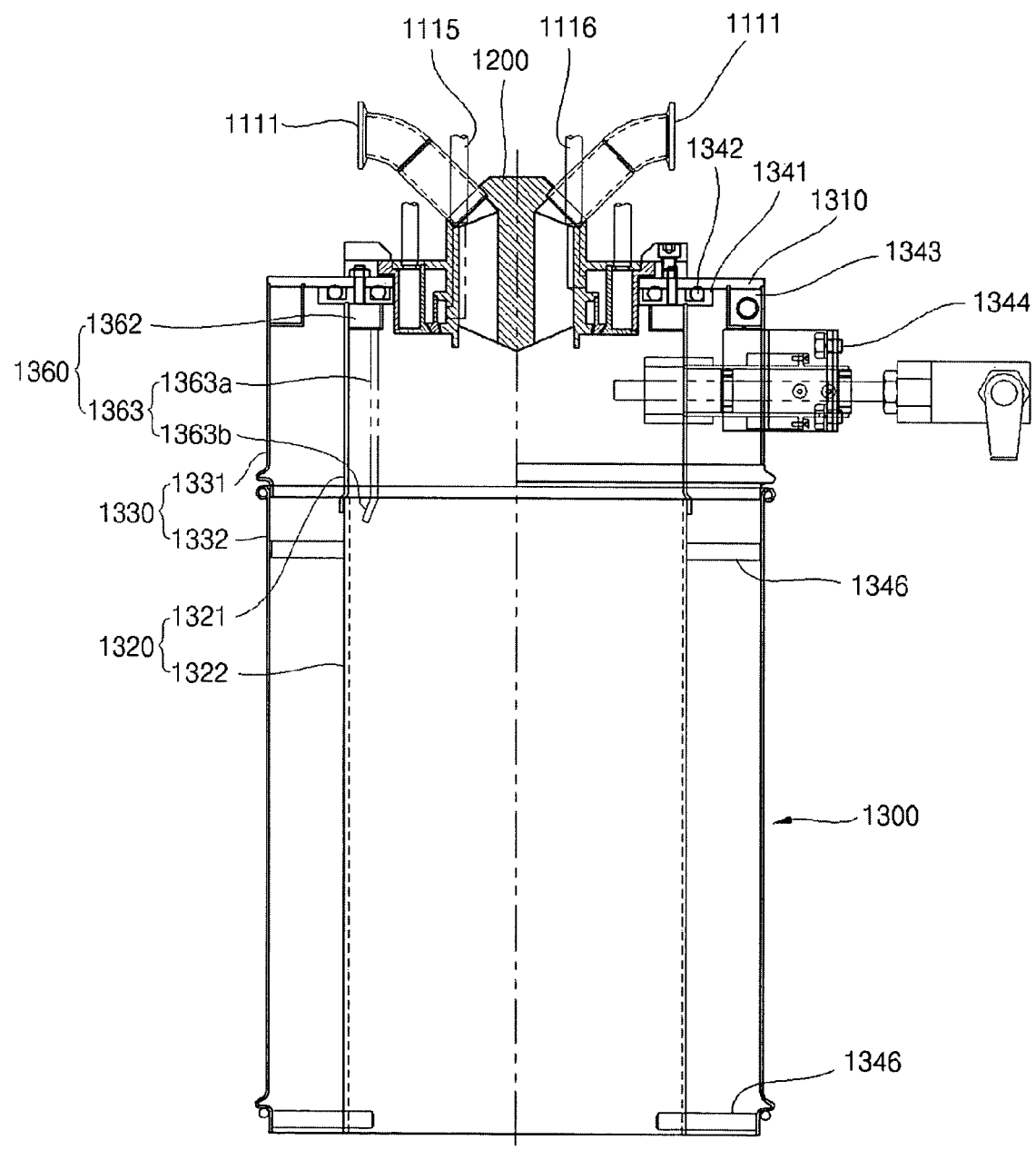
FIG. 11a is a right side view showing the burning chamber of the inventive semiconductor waste gas processing scrubber in section.
Figure 11B:
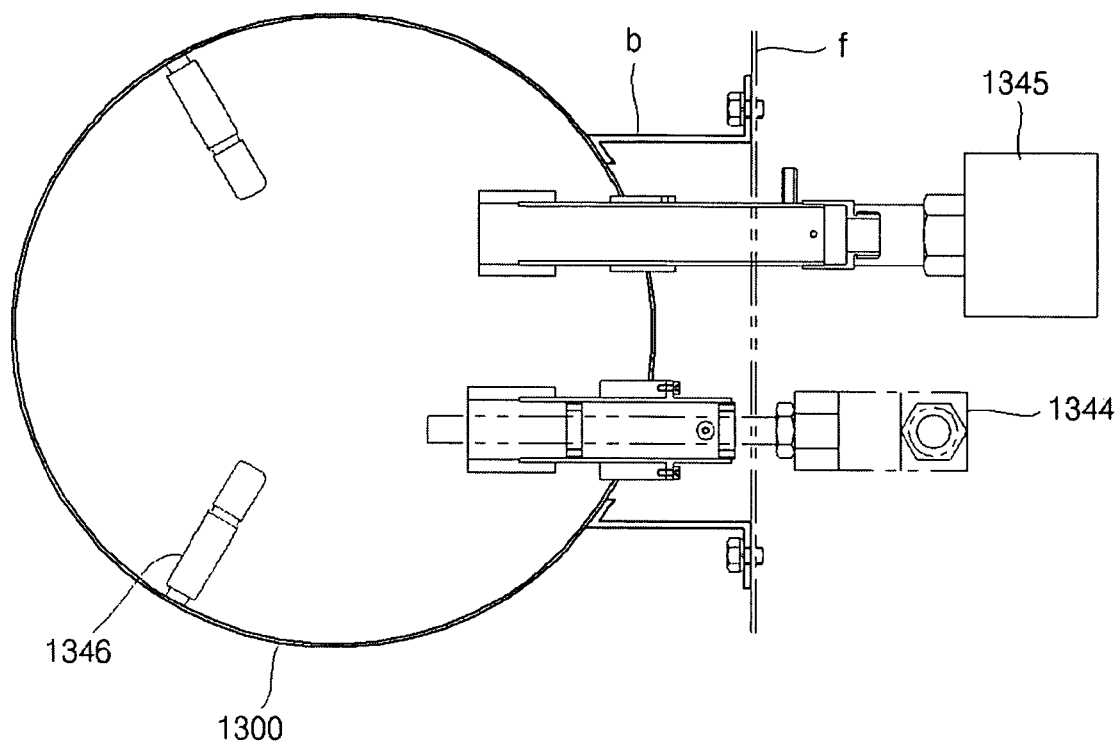
FIG. 11b is a cross-sectional view of the burning chamber.

FIGS. 11a and 11b are a right side view in section and a cross-sectional view, respectively, showing the burning chamber 1300 of the inventive semiconductor waste gas processing scrubber 1000.

As shown, according to the present invention, the pilot burner 1344 and the UV sensor 1345 are installed through the upper outer chamber 1331 and upper inner chamber 1321, and the burner 1200 is installed substantially at the central part of the top cover. In addition, anchoring members 1346 extend from the lower outer chamber 1332 in the lower outer chamber 1332, wherein the lower inner chamber 1322 is coupled to the anchoring members 1346. Because other components have all been described above with reference to FIGS. 10a and 10b, they are not described any further.

With the above-mentioned construction, the burning chamber 1000 and the particle removing gas supply section 1360 of the inventive semiconductor waste gas processing scrubber 1000 are operated as follows.

At first, fuel and oxygen are supplied from the fuel supply tube 1115 and the oxygen supply tube 1116, respectively, which are connected to the burner 1200, and then the pilot burner 1344 is operated so that a flame is generated from the burner 1200. The ignition state of the burner 1200 is sensed by the UV sensor 1345 and after the ignition of the burner 1200 is certainly implemented, the operation of the pilot burner 1344 is stopped.

Next, semiconductor waste gas is supplied from a semiconductor fabrication process line through the waste gas supply tube 1111 connected to the burner 1200. The waste gas is introduced into the inner chamber 1320 of the burning chamber 1300 through the burner 1200. The waste gas introduced into the inner chamber 1320 is burnt by the flame from the burner 1200, whereby a certain amount of particles is produced.

Here, coolant is supplied through the cooling tube 1343 installed in the outer camber 1330 and the top cover 1310, whereby the coolant flows along the outer wall 1610 of the inner chamber 1320, whereby the inner chamber 1320 is not heated above a predetermined temperature level.

During this operation, the inventive particle removing gas supply section 1360 is also operated. Namely, inert gas such as nitrogen is supplied through the gas supply tube 1361, and consequently supplied into the inner chamber 1320 through the gas tube 1362 and the gas nozzles 1363.

Each of the nozzles 1363 consists of a straight part 1363a and a curved part 1363b, in which the tip end of the curved part 1363b is oriented toward the inner wall of the inner chamber 1320, whereby the inert gas from the gas nozzles 1363 directly blows onto the inner wall of the inner chamber 1320. That is, a predetermined level of impulse is transferred to the inner wall of the inner chamber 1320. Therefore, the particles which are about to deposit or have already deposited on the inner wall of the inner chamber 1320 are separated and removed from the inner chamber 1320 and drop.

In addition, because there are four gas nozzles 1363, which are equi-spaced from each other centering on the center of the inner chamber 1320 and inclined by a predetermined angle with respect to the vertical direction of the inner chamber 1320, the inert gas is supplied in a swirl form to the inner chamber 1320 through the gas nozzles 1363. Therefore, the particles, which have deposited on the inner wall of the inner chamber 1320, are more effectively removed and drop.

As described above, the inert gas supplied to the interior of the inner chamber 1320 through the particle removing gas supply section 1360 is supplied in a pulsed form. Therefore, impulse is more effectively applied to the inner wall of the inner chamber 1320 due to the inert gas of the pulsed form, as a result of which the particles which are about to deposit or have already deposited on the inner wall are removed and freely drop.

Likewise, if a waste gas containing a large quantity of silicon is introduced, the inert gas supplied through the particle removing gas supply section 1360 can be continuously supplied. That is, because a large quantity of particles is produced when a waste gas containing a large quantity of silicon is burnt by the burner 1200, the inert gas is continuously supplied during the operation of the burner 1200. Of course, in this case, the inert gas is also supplied in the pulsed form.

In addition, if a waste gas containing a small quantity of silicon is introduced, the inert gas supplied through the particle removing gas supply section 1360 can be intermittently supplied for a predetermined length of time. That is, because a small quantity of particles is produced when a waste gas containing a small quantity of silicon is burnt by the burner 1200, the particles on the inner wall of the inner chamber 1320 could be sufficiently removed even if the inert gas is supplied for a predetermined length of time without needing to continuously supply inert gas during the operation of the burner 1200. Of course, the inert gas is also supplied in a pulsed form in this case.

Moreover, the inert gas supplied through the particle removing gas supply section 1360 may be supplied when the pressure within the inner chamber 1320 is substantially in the vicinity of the atmospheric pressure after the pressure within the inner chamber 1320 has been sensed. The condition that the pressure of the inner chamber 1320 is substantially in the vicinity of the atmospheric pressure means that the inner volume of the inner chamber has been reduced as the particles have deposited and accumulated on the inner wall more than a predetermined thickness. Accordingly, it is intended to remove the particles, which have deposited on the inner wall of the inner chamber 1320, by supplying the inert gas in a pulsed form to the interior of the inner chamber 1320.

Figure 12A:
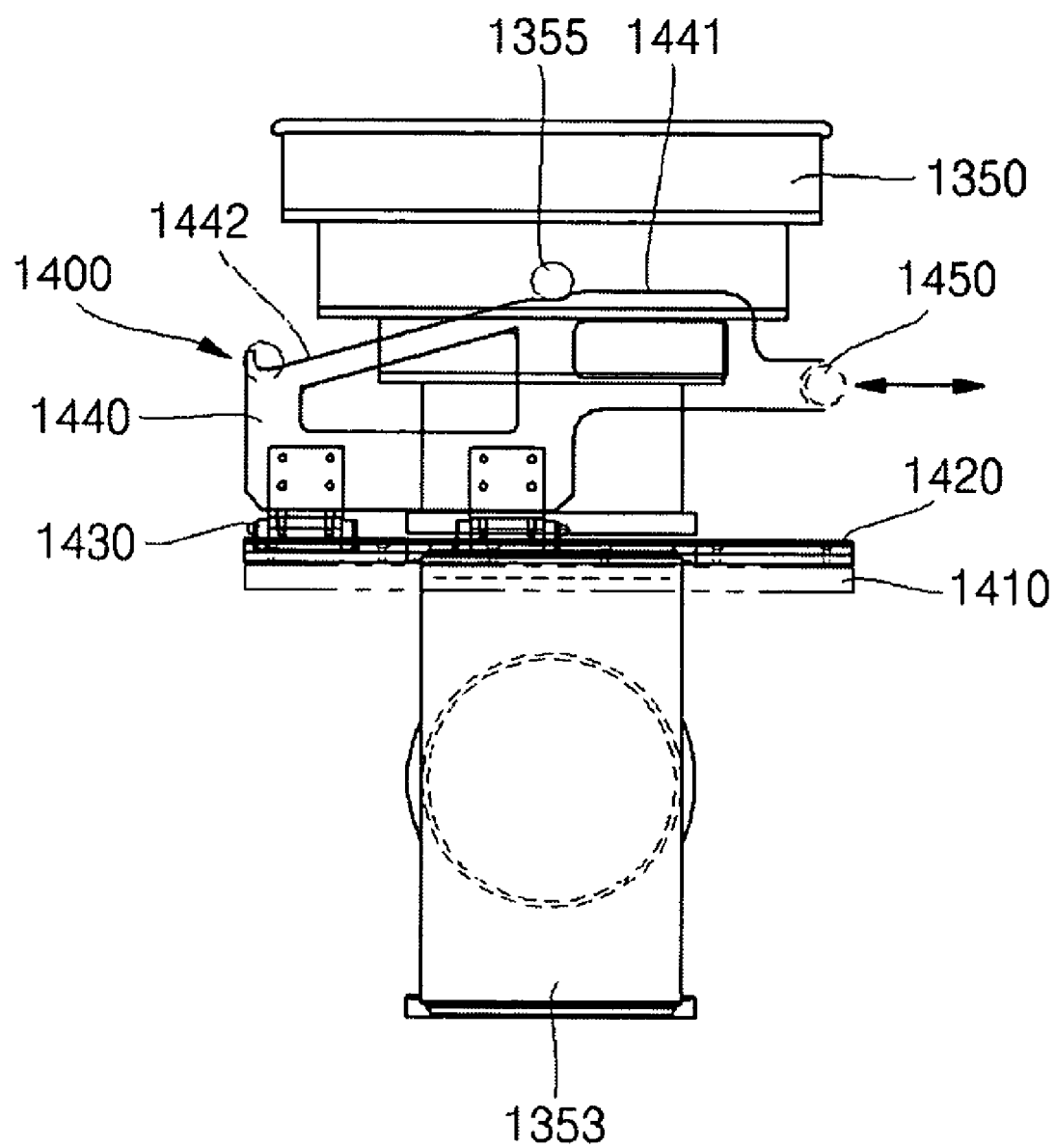
FIG. 12a is a left side view a lower chamber joined to the lower end of the inventive semiconductor waste gas processing scrubber, and a chamber support section.
Figure 12B:
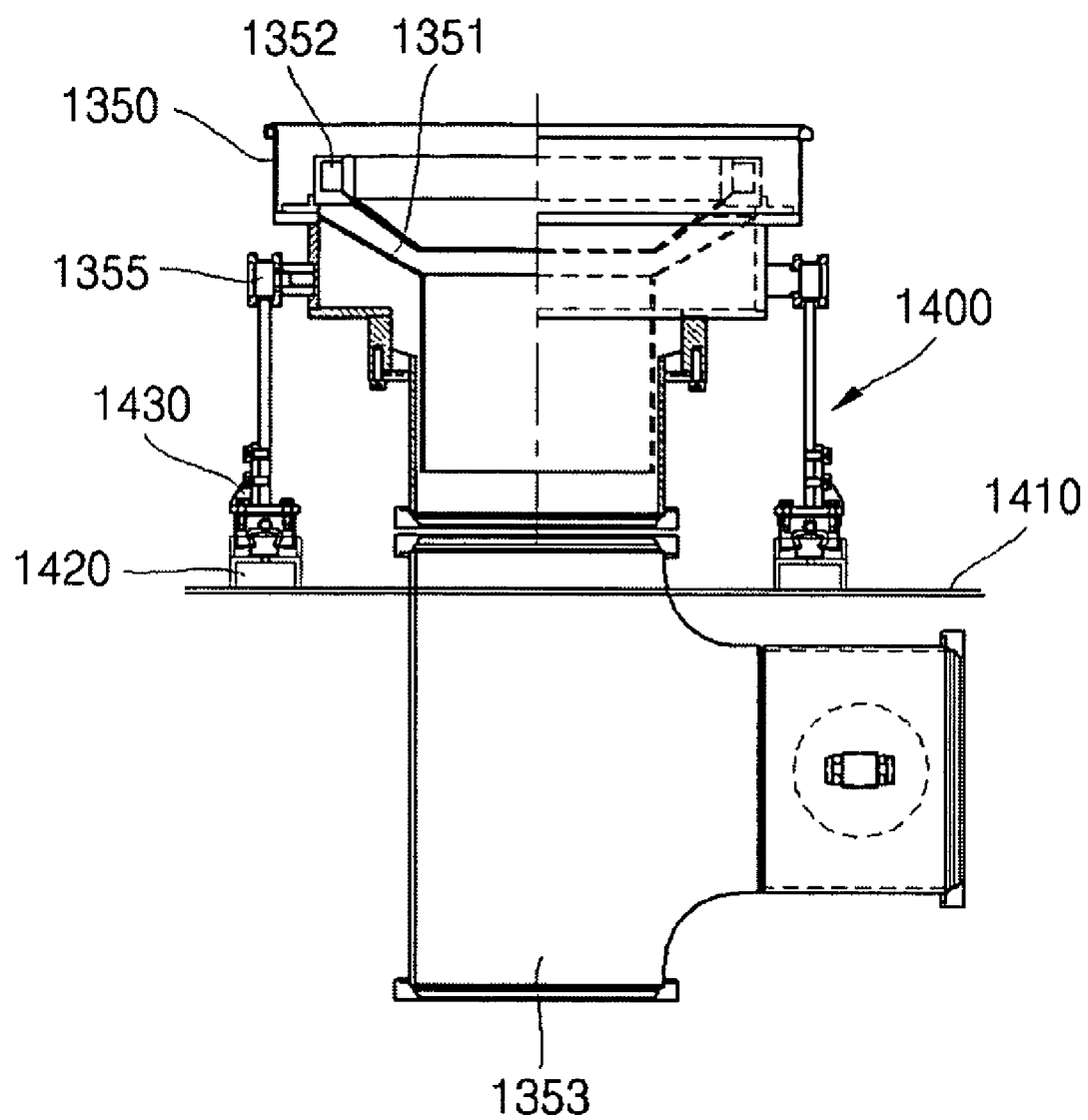
FIG. 12b is a right side view showing the lower chamber and the chamber support section partially in section.

FIGS. 12a and 12b are a left side view and a partially sectioned right side view showing a lower chamber 1350 joined to the lower end of the inventive semiconductor waste gas processing scrubber 1000, and a chamber support section 1400.

As shown, according to the present invention, the lower chamber 1350, which is substantially in a form of a funnel, is mounted on the lower part of the outer chamber of the burning chamber, in such a manner as to be detachable from the outer chamber, and a particle guide member 1351 is mounted in the lower chamber 1350, wherein the particle guide member 1351 is shaped substantially in a form of a funnel so as to guide the particles produced as the waste gas is burnt to the wet tower 1500 and the water reservoir tank 1600.

Here, the particle guide member 1351 is provided with an inert gas tube for injecting inert gas in order to prevent the vapor from being reintroduced into the burning chamber 1300 from the water reservoir tank 1600. In addition, an intermediate connection tube 1353 is connected to the lower end of the lower chamber 1350. Therefore, the particles drop toward the water reservoir tank 1353 through the intermediate connection tube 1353 after passing through the particle guide member 1351.

Furthermore, the chamber support section 1400 is fixed to the lower chamber 1350 so as to detachably support the burning chamber 1300.

The chamber support section 1400 includes: a pair of guide rails 1420 linearly installed on a support plate 1410; a pair of guide blocks 1430 mounted on the guide rails 1420 to be capable of reciprocating in the horizontal direction; support dies 1440, each having a horizontal surface 1441 formed at the top portion thereof and a descent surface 1442 extending downward from the horizontal surface in a predetermined angle; and one or more support rods 1450 for interconnecting the support dies 1440. In addition, the lower chamber 1350 is provided with rollers 1355, which are connected to be slidable according to the horizontal surfaces 1441 and the descent surfaces 1442.

Therefore, if an operator draws the support rods 1450 of the chamber support section 1400 to a side, the rollers 1355 of the lower chamber 1350 slide along the horizontal surface 1441 and then along the descent surface 1442, whereby the lower chamber 1350 can be readily separated to the lower part of the burning chamber 1300.

From this state, the lower inner chamber 1322 and the lower outer chamber 1332 can be separated in unison from the upper inner chamber 1321 and the upper outer chamber 1331. Therefore, the operator can rapidly and readily clean the interior of the burning chamber 1300.

Figure 13A:
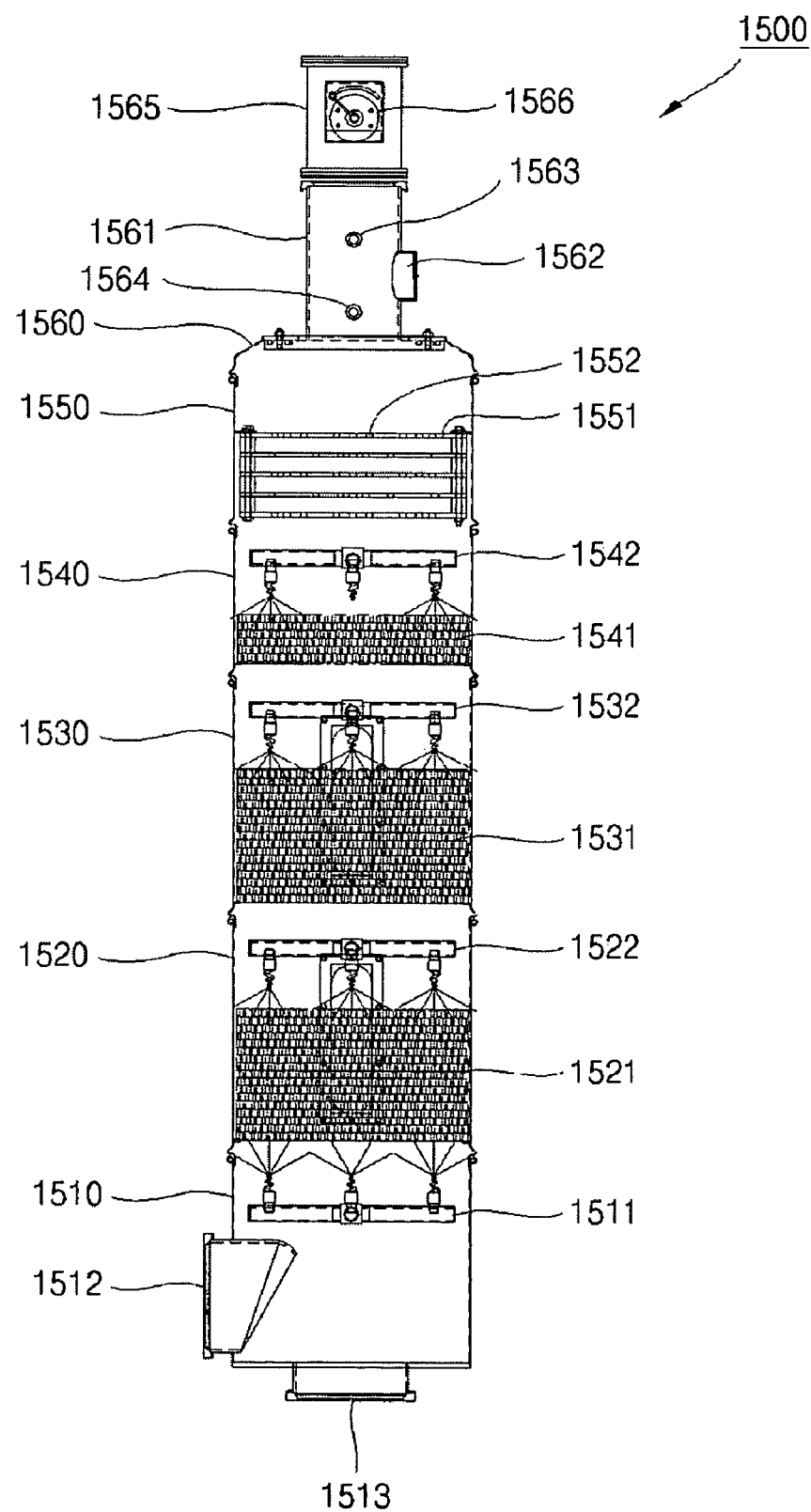
FIGS. 13a and 13b are front and right side views showing the wet tower of the inventive semiconductor waste gas processing scrubber in section.
Figure 13B:
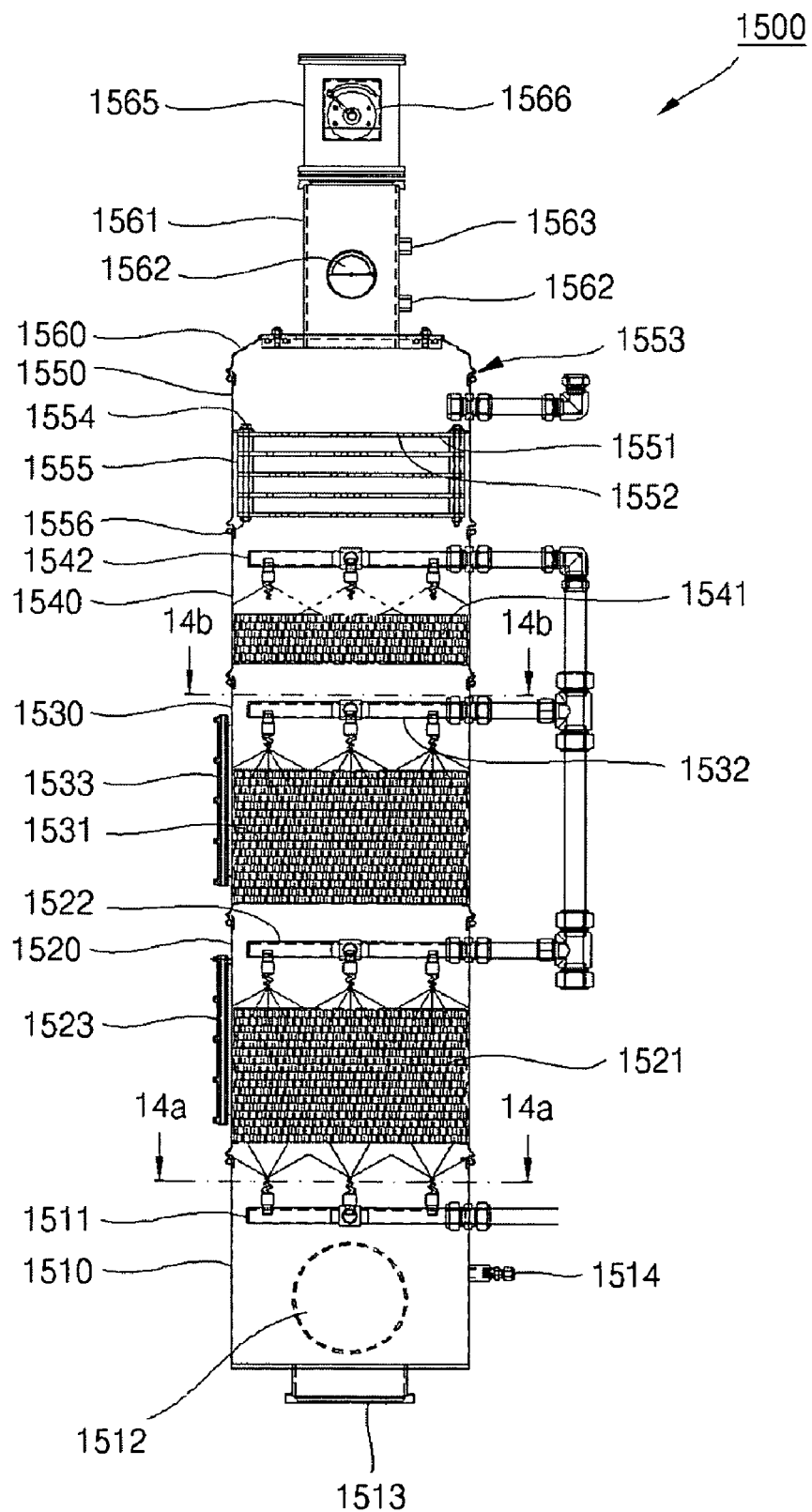

FIGS. 13a and 13b are front and right side views showing the wet tower 1500 of the inventive semiconductor waste gas processing scrubber 1000 in section.

As shown, the wet tower 1500 includes a base tower 1510, a first tower 1520, a second tower 1530, a third tower 1540, and a fourth tower 1550. According to the present invention, the first tower 1520, the second tower 1530, the third tower 1540, and the fourth tower 1550 can be detachably assembled to each other in different orders.

That is, according to the present invention, the first tower 1520 and the second tower 1530 may be identical to each other in height and diameter. In addition, the third tower 1540 and the fourth tower 1550 may be identical to each other in height and diameter. Therefore, it is possible to assemble or install the first tower 1520 and the second tower 1530 while interchanging the positions thereof. In addition, it is also possible to assemble or install the third tower 1540 and the third tower 1550 while interchanging the positions thereof.

Therefore, according to the present invention, the wet tower 1500 can be operated in various forms, which can be modified according to conditions of a semiconductor fabrication process and installation because it is possible to assemble or install the first tower 1520 and the second tower 1530 while interchanging the positions thereof and to assemble or install the third tower 1540 and the third tower 1550 while interchanging the positions thereof. Due to this, it is also possible to select and separate one or more desired towers from the wet tower 1500, as a result of which it is possible to selectively clean one or more towers as desired, thereby greatly reducing the length of time required for maintenance and repairing.

A first filter 1521 is assembled to the first tower 1520, a second filter 1531 is assembled to the second tower 1530, and a third filter 1541 is assembled to the third tower 1540, the porosities of the first to third filters 1521 are set to be different from each other. Specifically, the porosities are adapted to be reduced in the other of the first filter 1521, the second filter 1531 and the third filter 1541. Therefore, according to the present invention, particles can be filtered through three steps. The filtered particles drop to the water reservoir tank 1600 by water injected from base injection nozzles 1511 provided in the base tower 1510, first injection nozzles 1522 provided in the first tower 1520, the second injection nozzles 1532 provided in the second tower 1532, and the third injection nozzles 1542 provided in the third tower 1540, whereby the filter particles are consequently captured in the water in the water reservoir tank 1600.

Meanwhile, through the base injection nozzles 1511, fresh water is supplied from the outside, and through the first, second and third injection nozzles 1522, 1532 and 1542, water is supplied, which has been purified from the water reservoir tank 1600. For this purpose, a water supply pump (not shown) is connected to the base injection nozzles 1511 for supplying fresh water, a filtration section (not shown) is provided in the water reservoir tank, and a circulation pump (not shown) is connected to the first, second and third injection nozzles 1522, 1532 and 1542 for supplying water from the water reservoir tank. As a drain pump (not shown) is connected to the water reservoir tank, the water in the water reservoir tank does not overflow even if fresh water is continuously supplied by the water supply pump.

A top-opened cover 1560 is coupled to the top end of the fourth tower 1550, and a first exhaust tube 1561 is connected to the cover 1560, wherein the first exhaust tube 1561 has a cooled air supply port 1562, a pressure sensing port 1563 and a temperature sensing port 1564. Here, the cooled air of a lower temperature is supplied through the air supply port 1562, thereby causing fine particles to drop toward the fourth tower 1550 if such fine particles exist. Through the pressure sensing port 1563, the pressure of exhaust gas is sensed, and through the temperature sensing port 1564, the temperature of exhaust gas is sensed. If the pressure and temperature sensed through the pressure sensing port 1563 and the temperature sensing port 1564 are not within reference ranges, this is notified to the user through an alarm means or the operation of the apparatus is stopped.

A second exhaust tube 1655, which is provided with an exhaust amount control member 1566, is connected to the top end of the first exhaust tube 1561 so as to control the amount of exhaust. With the aid of such an exhaust amount control member 1566, it is possible to properly control the amount of purified gas depending on the particular amount of waste gas which is actually produced.

Now, the base tower 1510, the first tower 1520, the second tower 1530, the third tower 1540, and the fourth tower 1550 are described in more detail in terms of construction.

As shown, the base tower 1510 is formed substantially in a cylindrical shape and connected with the burning chamber 1300 and the water reservoir tank 1600 through an intermediate connection tube 1512 and a lower connection tube 1513, respectively. In addition, the base injection nozzles 1511, which are provided in the base tower 1510, are arranged to be capable of injecting water toward the first filter 1521, which is fitted in the first tower 1520. Here, a pressure sensing port 1515 is additionally formed in the base tower 1510 so as to sense the inner pressure of the base tower 1510. Therefore, according to the present invention, if the pressure values obtained from the pressure port 1514 provided in the base tower 1510 and the pressure port 1563 provided in the first exhaust tube 1561 are not within a reference range, this may be notified to the user through alarm means (not shown) or the operation of the apparatus may be stopped.

Next, the first tower 1520 is formed substantially in a cylindrical shape and installed on the top of the base tower 1510. In addition, the first injection nozzles 1522 of the first tower 1520 are arranged to be capable of injecting water downwardly above the first filter 1521. Therefore, all the particles, which could deposit or accumulate on the first filter 1521, drop downwardly through the base injection nozzles 1511 positioned below the first filter 1521 and the first injection nozzles 1522 positioned above the first filter 1521. Here, a first transparent window 1523 may be additionally provided through the wall of the first tower 1520, so that the first filter 1521 can be visually seen. Therefore, the condition of the first filter 1521 can be visually seen through the first transparent window 1523, whereby the cleaning timing of the first filter 1521 can be precisely determined.

The second tower 1530 is also formed substantially in a cylindrical shape and installed above the first tower 1520. In addition, the second injection nozzles 1532 of the second tower 1530 are arranged to be capable of injecting water downwardly above the second filter 1531. Here, a second transparent window 1533 may be additionally provided through the wall of the second tower 1530, so that the second filter 1531 can be visually seen. Therefore, according to the present invention, the cleaning timing of the second filter can be precisely determined.

The third tower 1530 is also formed substantially in a cylindrically form and installed above the third tower 1540. In addition, the third nozzles 1542 of the third tower 1540 are arranged to be capable of injecting water downwardly above the third filter 1541.

The fourth tower 1540 is also formed substantially in a cylindrical shape and installed above the third tower 1540. In addition, a plurality of impact plates 1551, each of which is formed with plural through-holes 1552, are provided in the fourth tower 1550 in such a manner as to be vertically spaced from each other, with the through-holes 1552 formed in one impact plate 1551 being staggered in relation to those formed in an adjacent impact plate 1551. The impact plates 1551 are stacked and anchored to each other by a plurality of bolts 1554, spacers 1555 and nuts, whereby forming a single integral structure. Therefore, according to the present invention, even if passing through the first filter 1521, the second filter 1531 and the third filter 1541, particles impact against the impact plates 1551, thereby being eventually filtered. In addition, the gas supply pipe 1553 is arranged to downwardly supply inert gas such as nitrogen above the impact plates. If the inner pressure of the inventive wet tower 1500 is increased (that is, if a lot of particles are adsorbed in the filters or impact plates), a given quantity of inert gas is supplied through the gas supply pipe 1553, so that all the particles, which have adhere to the filters 1521, 1531 and 1541 and the impact plates 1551, can be removed. That is, the gas supplied from the gas supply pipe 1553 serves to provide a certain level of impulse for the filters 1522, 1531 and 1541 and the impact plates 1551, so that the particles are separated from the filters and plates.

Figure 14A:
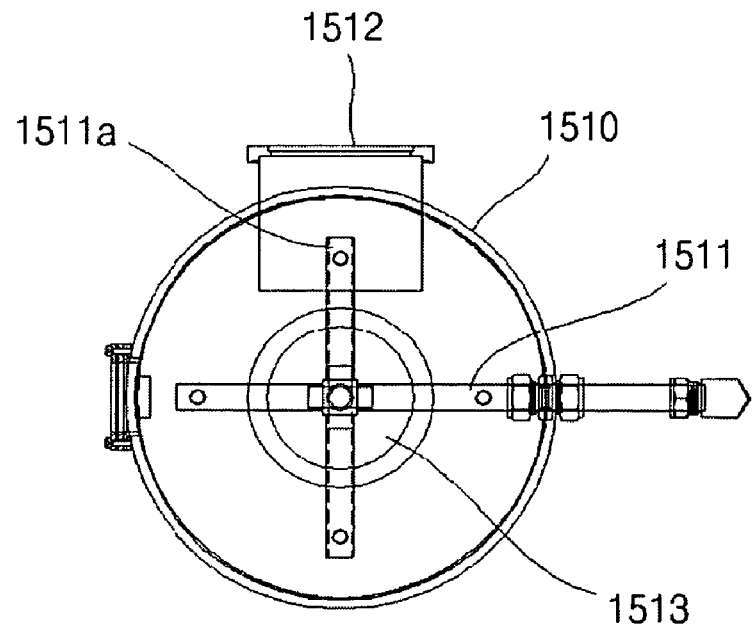
FIGS. 14a and 14b are cross-sectional views taken along line 14a-14a and line 14b-14b, respectively.
Figure 14B:
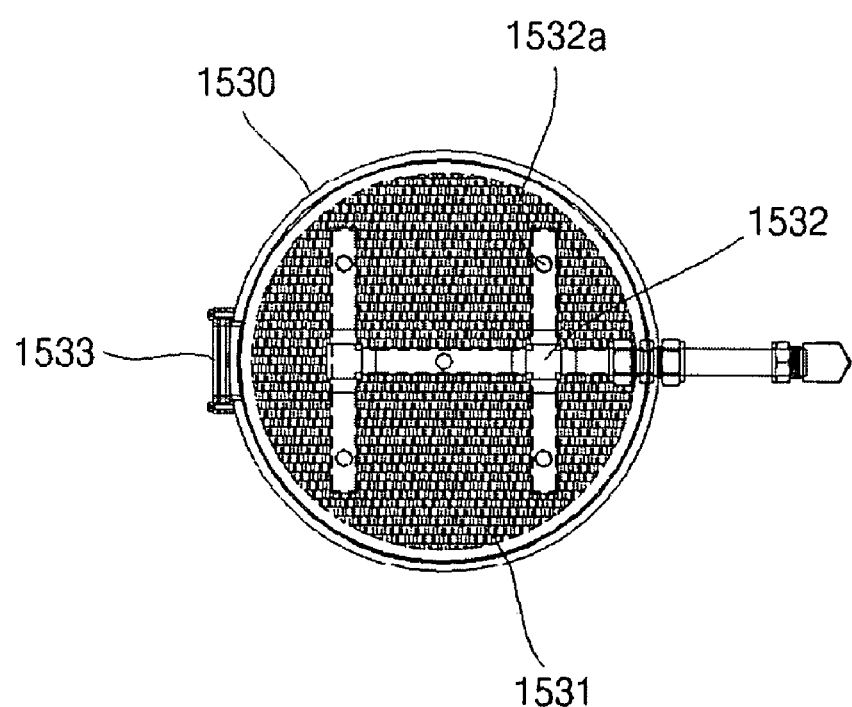
Figure 14C:
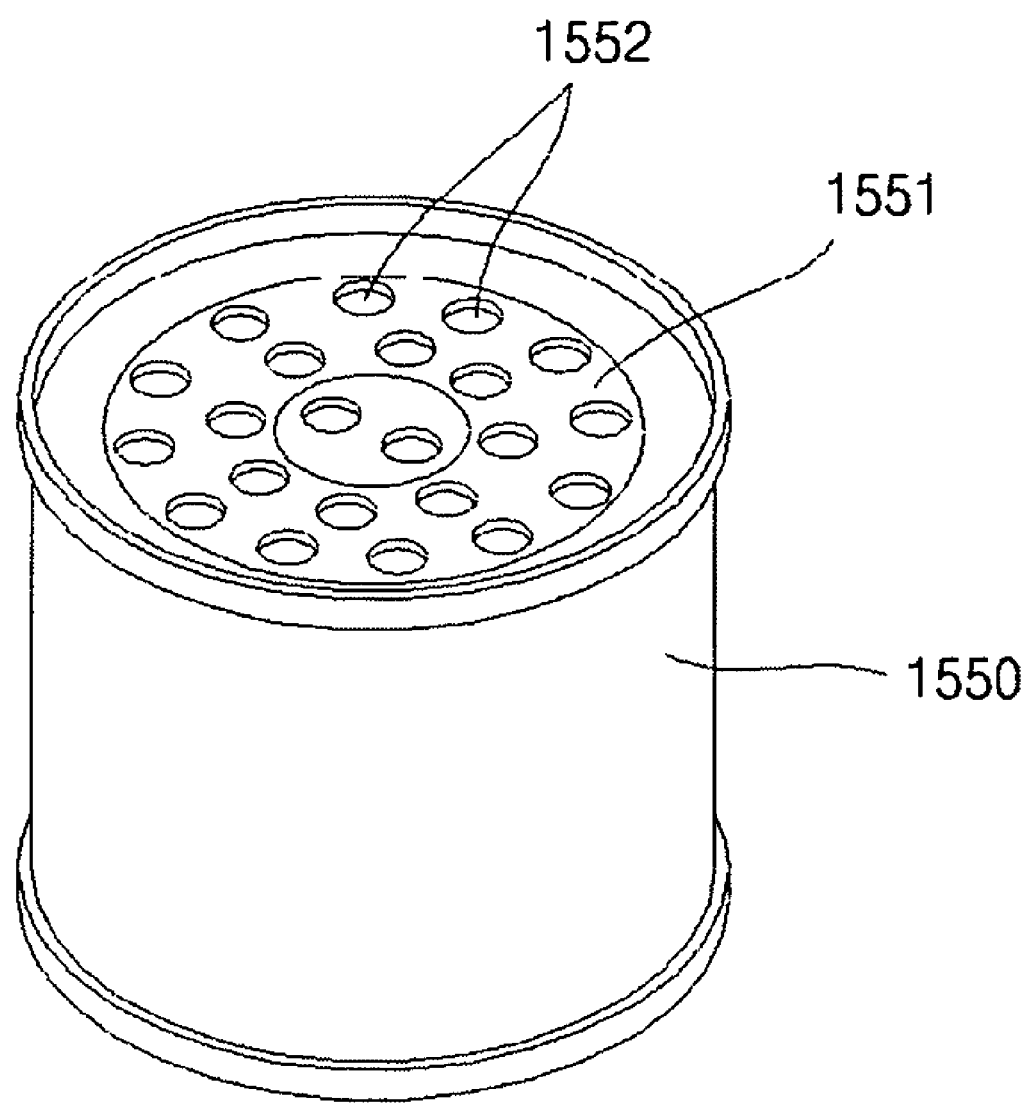
FIG. 14c is a perspective view of an area 14c of FIG. 13b.
Figure 15A:
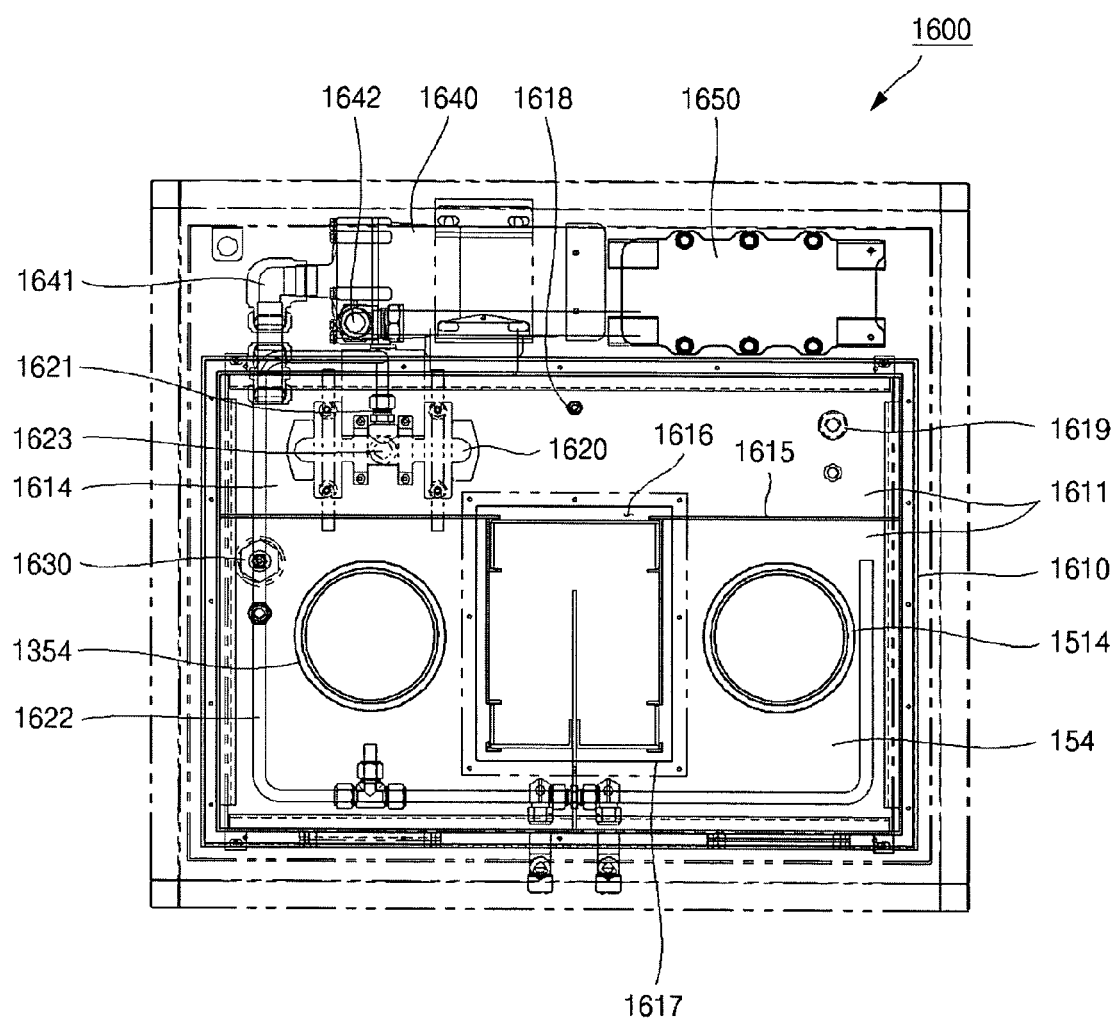
FIGS. 15a to 15d are top plan view, left side view, front view and right side view showing the water reservoir tank 1600 of the inventive semiconductor waste gas processing scrubber 1000 in section.
Figure 15B:
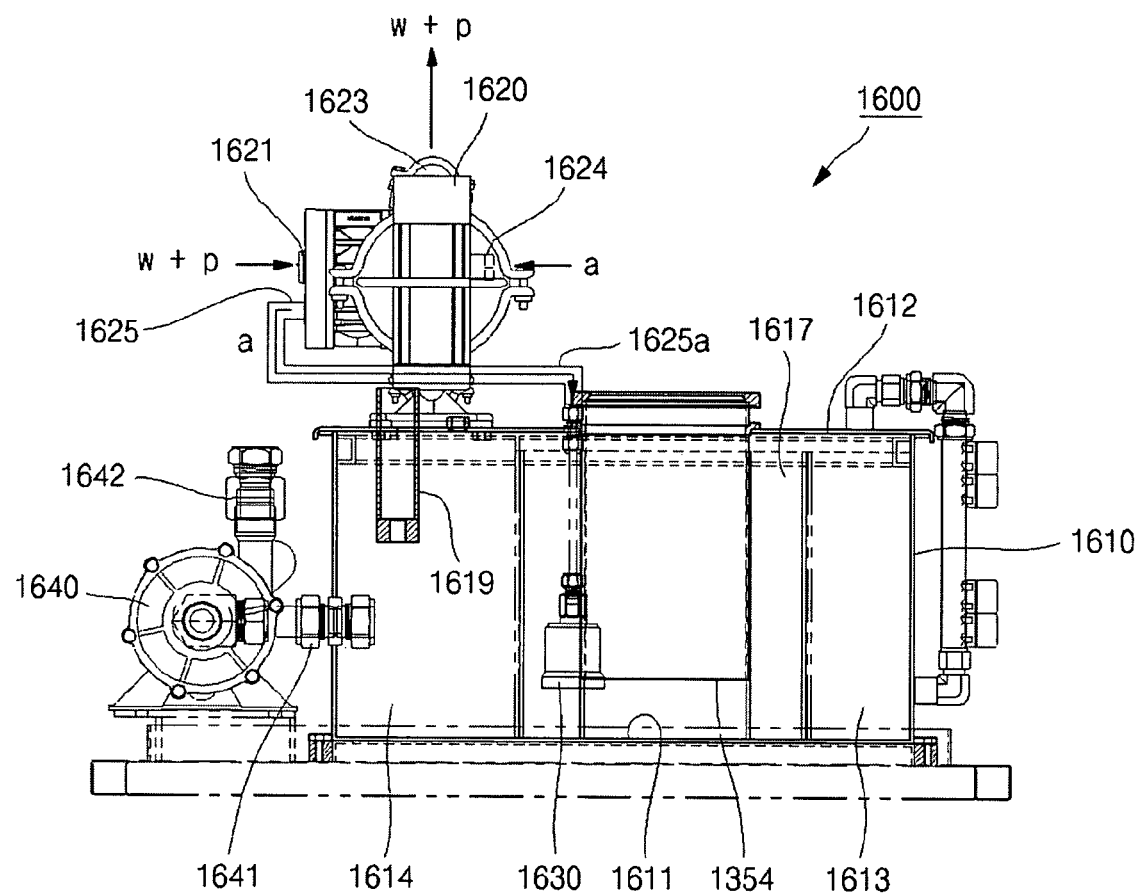
Figure 15C:
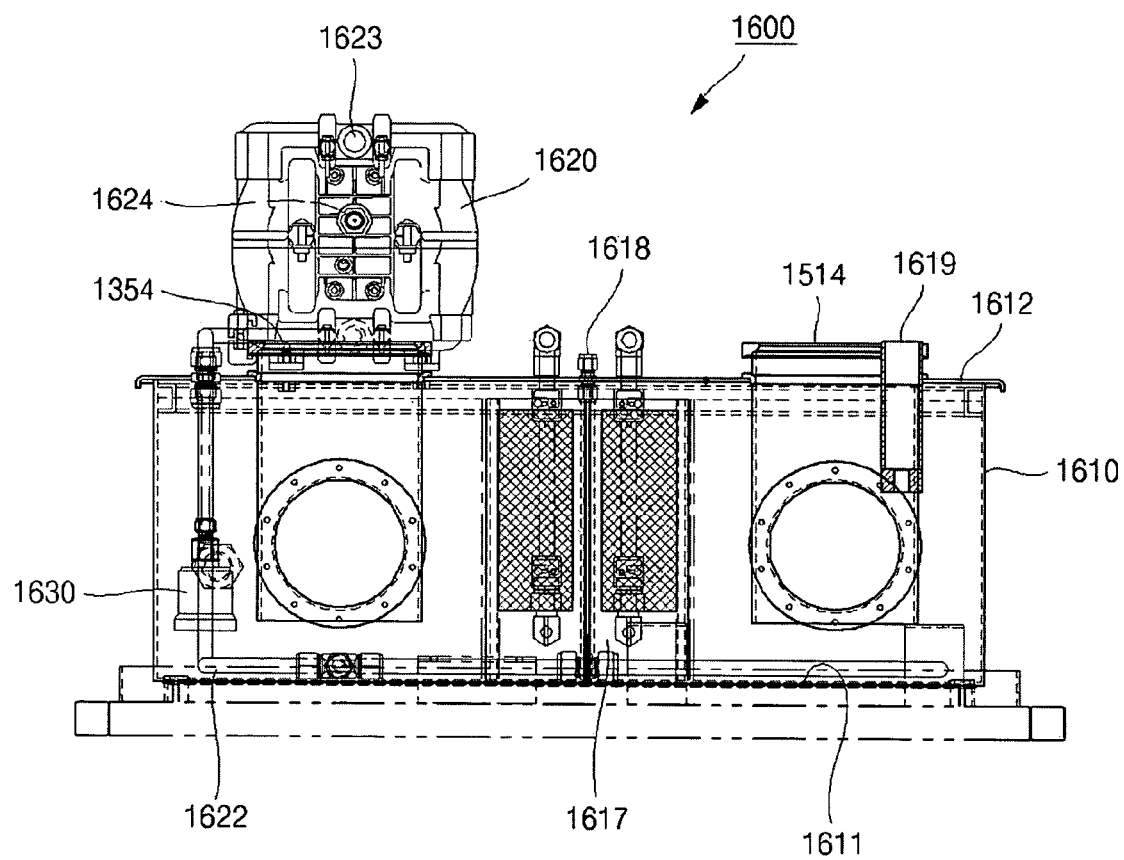
Figure 15D:
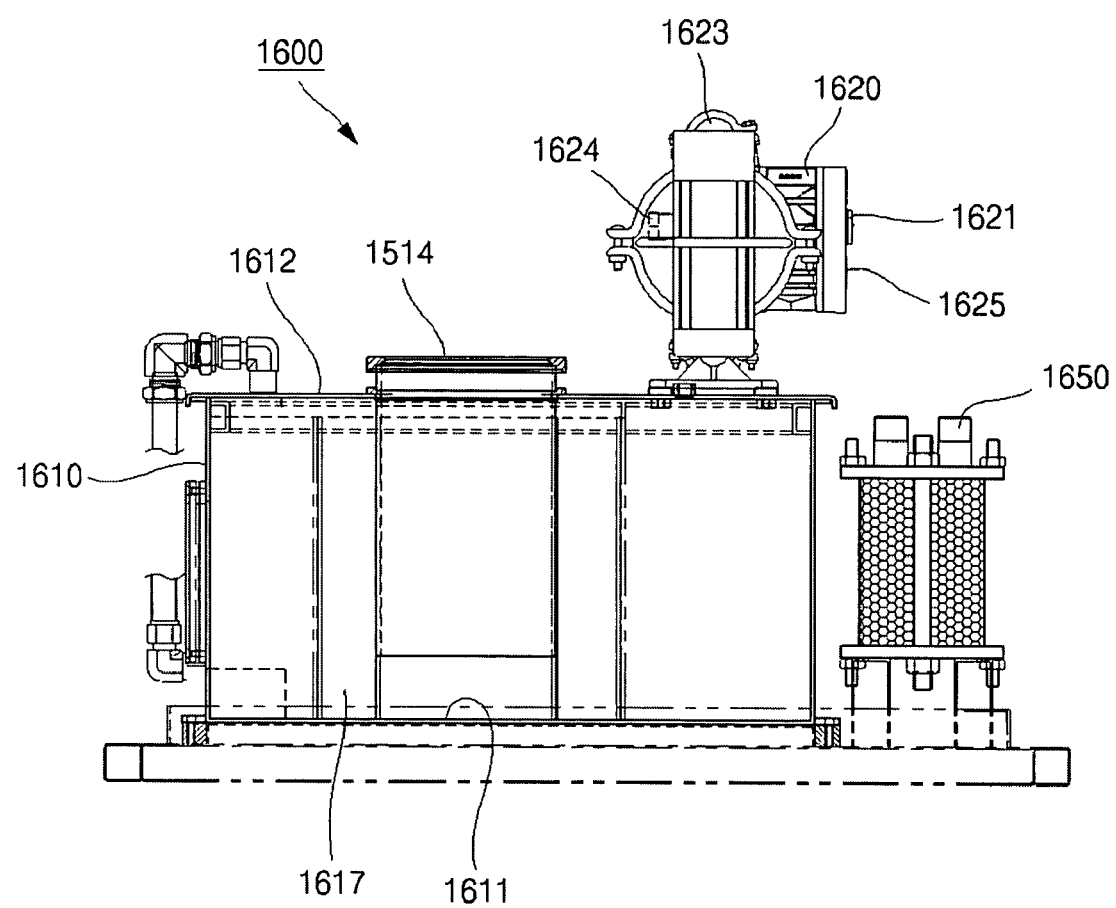

FIGS. 14a and 14b are cross-sectional views taken along line 14a-14a and line 14b-14b, respectively, and FIG. 14c is a perspective view of an area 14c of FIG. 13b.

As shown in FIG. 14a, the base injection nozzles 1511 may be arranged crosswise in the base tower 1510. Injection through-holes 1511a are formed at the center and terminal ends of the base injection nozzles 1511, so that water can be upwardly injected from the lower part of the base tower 1510 through total five through-holes 1511a. However, the present invention is not limited by the arrangement of the base injection nozzles 1511 and the number of the injection through-holes 1511a formed in the base injection nozzles 1511a.

As shown in FIG. 14b, the second injection nozzles 1532 may be arranged in an "H" form in the second tower 1530. Injection through-holes 1532a are formed at the center and four terminal ends of the second injection nozzles 1532, so that water can be injected through total five injection through-holes 1532a to the second filter 1531 positioned below the second injection nozzles 1532. However, the present invention is not limited by the arrangement of the second injection nozzles 1532 and the number of the injection through-holes 1532a formed in the second injection nozzles 1532a.

As shown in FIG. 14c, the impact plates 1551 are provided within the fourth tower 1550, wherein each of the impact plates is formed with a plurality of through-holes 1552, each of which has a relatively large diameter. Because the through-holes 1552 formed in one impact plate 1551 are staggered with respect to those formed in an adjacent impact plate 1551 as described above, particles impact against each of the impact plates 1551 while dropping through the through-holes 1552. (여기)

With the above-mentioned construction, the inventive wet tower 1500 is operated as follows.

At first, the waste gas produced from a semiconductor process line is burnt by a flame from the burner 1200 within the burning chamber 1300, whereby particles are produced, and among the produced particles, relatively heavy particles directly drop to the water reservoir tank 1600. In addition, relatively light particles are moved toward the base tower 1510 of the wet tower 1500 through the intermediate connection tube 1512.

Thereafter, the particles pass through the first filter 1521 installed in the first tower 1520 while ascending to the first tower 1520. At this time, the particles which are larger than the voids of the first filter are all entrapped by the first filter 1521. The particles entrapped in this manner are caused to drop by the water injected from the base injection nozzles 1511 and the first injection nozzles, which are positioned below and above the first filter 1521, respectively, to the water reservoir tank through the lower connection tube 1513 installed below the base tower 1510.

Next, the particles, which have passed through the first filter 1521 of the first tower 1520, tend to pass through the second filter 1531 installed in the second tower 1530. At this time, the particles which are larger than the voids of the second filter 1531 are all entrapped by the second filter 1531. The particles entrapped in this manner are dropped below the second filter 1531 by water injected from the second nozzles 1532, which are positioned above the second filter 1531. The particles, which have dropped thereby, drop into the water reservoir tank 1600 through the first filter 1521 and the lower connection tube 1513.

Next, the particles, which have passed through the second filter 1531 of the second tower 1530, tend to pass through the third filter 1514 installed in the third tower 1540. At this time, the particles which are larger than voids of the third filter 1541 are all entrapped. The particles entrapped in this manner are dropped below the third filter 1541 by the water injected from the third injection nozzles 1542 which are positioned above the third filter 1541. The particles, which have dropped thereby, drop into the water reservoir tank 1600 through the second filter 1531, the first filter 1521 and the lower connection tube 1513.

Next, the particles, which have passed through the third filter 1541 of the third tower 1540, pass through the through-holes 1552 of the impact plates 1551 installed in the fourth tower 1550. At this time, most of the particles directly impact against the impact plates 1551 and drop downward without ascending any more. In addition, inert gas such as nitrogen gas is supplied through the gas supply pipe 1553 downwardly from the above of the impact plates 1551, thereby removing the particles from the impact plates 1551 and the particles removed in this manner consequently drop into the water reservoir tank 1600 through the third filter 1541, the second filter 1531 and the lower connection tube 1513.

As a result, the gas, which passes through the base tower 1510, the first tower 1520, the second tower 1530, the third tower 1540, and the fourth tower 1550, is purified gas, which substantially all particles have been removed. Finally, the purified gas is cooled by cold air supplied through the cooled air supply port 1562 while the purified gas is passing through the first exhaust tube 1561, and then descends to the impact plates 1551. As a result, the waste gas discharged to the outside through the first exhaust tube 1561 and the second exhaust tube 1562 is substantially completely purified in such a manner as to be substantially free of particles.

As described above, the base tower 1510 and the first exhaust tube 1561 are formed with pressure sensing ports 1514 and 1563, respectively. Therefore, the difference between the pressure of the gas passing through the base tower 1510 and the pressure of the gas passing through the first exhaust tube 1561 can be determined. If the pressure difference is too high between the gas passing through the base tower 1510 and the gas passing through the first exhaust tube 1561, it means that a lot of particles deposit or accumulate in the first filter 1521, the second filter 1531, the third filter 1541, and the impact plates 1551. Accordingly, the user is informed of this condition by alarm means (not shown) or the operation of the installation is stopped.

When such alarm means is activated, inert gas of a predetermined pressure is supplied through the gas supply pipe 1553 provided in the fourth tower 1550, so that impulse by the inert gas is adapted to be transferred to the impact plates 1551, the third filter 1541, the second filter 1531 and the first filter 1521, whereby the particles are removed from the impact plates and filters.

If the pressure differential between the upper and lower parts is too high despite the supply of gas through the gas supply pipe 1553, this means that the time for separating and cleaning at least one of the first tower 1520, the second tower 1530, the third tower 1540, and the fourth tower is near. Such a condition is notified to the user through an alarm means (not shown) and the operation of the apparatus is stopped.

FIGS. 15a to 15d are top plan view, left side view, front view and right side view showing the water reservoir tank 1600 of the inventive semiconductor waste gas processing scrubber 1000 in section.

As shown, the water reservoir tank 1600 includes a peripheral wall 1610, which is formed substantially in a square shape in cross-section, a bottom wall 1611 for closing the bottom side of the peripheral wall, and a top cover 1612 for closing the top side of the peripheral wall 1610. That is, the water reservoir tank 1600 generally takes a form of a hollow rectangular parallelepiped, and contains a certain quantity of water.

In addition, the water reservoir tank 1600 further includes: a first region 1613, to which the burning chamber 1300 and the wet tower 1500 are connected via the lower connection tubes 1354 and 1514, respectively; a second region 1614 separated from the first region 1613 by a partition 1615 with an opening 1616; and a filtration section 1617 fitted in the opening 1616. The lower connection tubes 1354 and 1514 are communicated with the top cover 1612 of the water reservoir tank 1600 and sunk by a predetermined depth in the water contained in the water reservoir tank 1600.

In addition, a drain pump 1620 is provided at the top of the rear area of the top cover 1612 of the water reservoir tank 1600. The drain pump 1620 has a fluid inlet port 1612 and a fluid outlet port 1623, so that water and particles can be suctioned and discharged in unison. Furthermore, the drain pump 1620 is also provided with an air inlet port 1624 and an air outlet port 1625, so that pneumatic pressure can be supplied to or drained from the drain pump 1620 so as to operate the drain pump 1620. Here, the fluid inlet port 1612 formed in the top of the rear side of the drain pump 1620. An inlet pipe 1622 is connected to the fluid inlet port 1621, wherein the inlet pipe 1622 extends to the bottom of the water reservoir tank 1600 and is seated on the first region 1613, so that it can suction the particles and water from the water reservoir tank 1600. In addition, because the fluid outlet port 1623 is formed substantially at the top end of the drain pump 1620, the particle and water can be completely discharged to the outside. Although not shown in the drawing, an outlet pipe is connected to the fluid outlet port 1623. In the drawing, reference symbol "a" denotes air and "w+p" denotes water and particles.

Meanwhile, the air inlet port 1624 is formed in front of the drain pump 1620 and an air supply pipe (not shown), which is previously provided in a semiconductor line, is connected to the air inlet port 1624. In addition, the air outlet port 1625 is formed at the lower end of the rear side of the drain pump 1620 and a bubbler 1630 is connected to the air outlet port 1625 through a pipe 1625a. The bubbler 1630 is positioned in the first region of the water reservoir tank 1600. Of course, the bubbler 1630 extends through the top cover 1612 and is sunk by a predetermined depth in the water of the water reservoir tank 1600.

With the above-mentioned construction, the air wasted at the time of operating the drain pump 1620 is transferred to the bubbler 1630 through the air outlet port 1625 and the pipe 1625a, whereby a predetermined level of impulse is periodically transferred to the air in the first region 1613 of the water reservoir tank 1600. Therefore, the particles, which tend to settle and deposit in the first region 1613, always float in the water. Consequently, the particles floating in this manner are readily discharged to the outside together with water along the inlet pipe 1622, the fluid inlet port 1621, and the fluid outlet port 1623, as the drain pump 1620 is operated. That is, the particles do not settle nor deposit on the bottom of the water reservoir tank 1600 by more than thickness. Here, the bubbler 1630 may preferably but not exclusively be formed from a noise reducer or the like, that is capable of reducing noise from the drain pump 1620 as well as delivering a predetermined level of impulse to the water. Although the drawing shows only one bubbler 1630 coupled to the top cover 1612, it is preferable to provide at least three bubblers, which are connected to and spaced from the top cover 1612 corresponding to the first region 1613, so that the settling or deposition of particles can be prevented all over the first region 1613 of the water reservoir tank 1600.

Meanwhile, the partition 1615 dividing the water tank 1600 into the first and second area 1613 and 1614 is also provided with a filtration section 1617, which is formed in a rectangular shape when shown in a top plan view and each side of which has a filter. Therefore, when the water in the first region 1613 flows to the second region 1614, the water flows after particles are filtered by the filtration section 1617. Accordingly, the water in the first region 1613 is relatively muddy as it contains particles and the water in the second region 1613 is relatively clean as the particles have been filtered.

Because the first region 1613 contains water and particles, the burning chamber 1300 is connected to the first region 1613 through a lower connection tube 1354 and the wet tower is connected to the first region 1613 through another connection tube 1514. In addition, the bubbler 1630 and the inlet pipe 1622 connected to the air outlet port 1625 of the drain pump 1620 are also positioned in the first region 1613 due to the above-mentioned reason.

A sodium hydroxide inlet 1618 is formed in the top cover 1612 corresponding to the second region 1614 of the water reservoir tank 1600. In addition, at a side of the sodium hydroxide inlet 1618, a pH sensor is connected for sensing the pH value of the water contained in the reservoir tank 1600. In the drawing, only a sensor bracket 1619 for attaching the pH sensor is shown. In general, the particles produced after the semiconductor waste gas is burnt increase the acidity of the water after being captured in the water. That is, the particles acidify the water. Therefore, the acidity of the water is measured by the pH sensor as described above and an amount of sodium hydroxide is put into the water through the sodium hydroxide inlet 1618. Thereby, the water contained in the water reservoir tank 1600 is always maintained at the neutral state. In this manner, it is also possible to prevent various structures assembled in the water reservoir tank 1600 from being corroded by the water.

Figure 16:
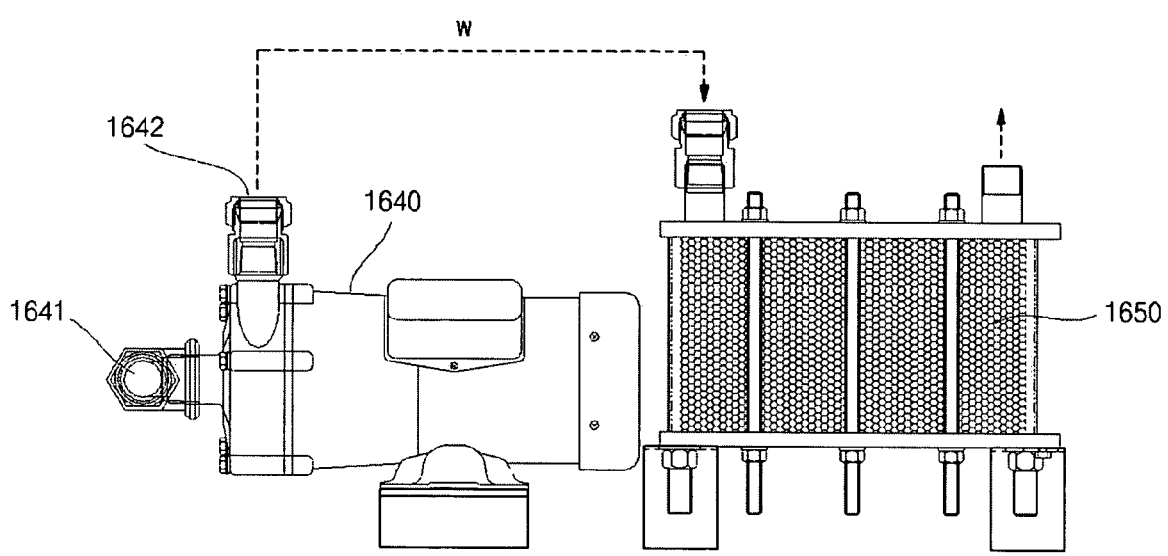
FIG. 16 is a side view showing a circulation pump and a heat exchanger for purifying and supplying water from the water reservoir tank of the inventive semiconductor waste gas processing scrubber to the wet tower.

A circulation pump 1640 is connected to the rear side wall 1600 of the water reservoir tank 1600. Such a circulation pump 1640 also has an inlet port 1641 and an outlet port 1642. The inlet port 1641 of the circulation pump 1640 is also connected to the outer wall 1610 corresponding to the second region of the water reservoir tank 1600. In addition, the outlet port 1642 of the circulation pump 1640 is connected to a heat exchanger 1650. Therefore, the temperature of the water of the water reservoir tank is increased by the water for cooling the burning chamber 1300 or the particles passing through the burning chamber 1300, wherein the water is cooled by the circulation pump 1640 and the heat exchanger 1650. In addition, the water passing through the heat changer 1650 is supplied to the wet tower 1500 and then dropped again to the first region 1613 of the water reservoir tank 1600 through the lower connection tube 1514. Therefore, the fine particles captured as a whole from the wet tower 1500 are completely captured in the water contained in the first region 1613 of the water reservoir tank 1600 and the water is also cooled by the circulation pump 1640 and the heat exchanger 1650. The relationship between the circulation pump 1640 and the heat exchanger 1650 is shown in more detail in FIG. 16.

With the above-mentioned construction, the particle discharge apparatus of the inventive semiconductor processing scrubber 1000 is operated as follows.

As is well-known, if semiconductor waste gas is burnt by the burner 1200 and the burning chamber 1300, particles are produced. Among the produced particles, relatively heavy particles drop due to their weight to the first region 1613 of the water reservoir tank 1600 through the lower connection tube 1354. Of course, the particles which have dropped thereby are captured in the water contained in the first region 1613.

Meanwhile, relatively light fine particles are transferred to the wet tower 1500 through the intermediate connection tubes 1353 and 1513 without dropping. However, the wet tower 1500 is designed, so that that water drops from the upper part to the lower part thereof, and is provided with a plurality of filters (not shown), the fine particles also drop to the first region 1613 of the water reservoir tank 1600 through the lower connection tube 1514. Therefore, the fine particles which have dropped down are also captured in the water contained in the first region 1613.

Next, the water of the first region 1613 is dirtied by the particles which have dropped and captured therein. Therefore, the drain pump 1620 is operated so as to discharge the dirtied water (particles and water) to the outside by a predetermined quantity at a time.

Here, the drain pump 1620 is a diaphragm pump which is pneumatically operated. Therefore, the powder contained in the first region 1613 and particles are suctioned by the fluid inlet port 1621, and discharged to the outside through the fluid outlet port 1623. In addition, the air suctioned through the air inlet port 1625 is discharged through the air outlet port after operating the drain pump 1620, and the discharged air is transferred to the bubbler 1630 through the pipe 1625a. Therefore, a predetermined level of impulse is applied to the water contained in the first region by the bubbler 1630 as long as the drain pump 1620 is operated.

Therefore, the particles captured in the first region 1613 continuously float in the water without settling or depositing on the bottom 1611 of the water reservoir tank 1600. Accordingly, the floating particles and water are transferred to the drain pump through the fluid inlet pipe 1622 and the fluid inlet port 1621, and then discharged to the outside through the fluid outlet port 1623, whereby the particles in the water reservoir tank 1600 are easily discharged to the outside together with the water. Even if depositing on the bottom 1611 of the water tank 1600 by a predetermined thickness, the particles are broken up by the bubbles and impulse produced from the bubbler 1630 and float in the water. In addition, if a plurality of bubblers 1630 (for example, three bubblers) are provided in the first region 1613 and spaced from each other, it is possible to prevent the particles from depositing or becoming hardened at a specific area in the first region 1613.

Next, in the rear side of the outer wall 1610 of the water reservoir tank 1600, the circulation pump 1640 suctions water from the second region 1614 and sends the water to the heat exchanger 1650, which in turn sends the water to the wet tower 1500. Therefore, the water in the first region 1613 of the water reservoir tank 1600 naturally flows to the second region 1614 through the filtration section 1617 installed between the first region 1613 and the second region 1614. Because the particles floating in the first region 1613 could not pass through the filtration section 1617, the second region 1614 is only supplied with relatively clean water. However, the water drops again from the wet tower 1500 to the first region 1613 of the water tank 1600 through the lower connection tube 1514, as a result of which the fine particles in the wet tower 1500 are captured in the first region 1613 of the water reservoir tank 1600 again.

Meanwhile, the pH sensor measures the acidity of the water in the water reservoir tank 1600 as described above. If the acidity exceeds a predetermined range as the result of the pH measurement, sodium hydroxide is put in the water reservoir tank 1600 through the sodium hydroxide inlet 1618. Of course, the sodium hydroxide can be put in the water reservoir tank 1600 automatically through a mechanical and electrical arrangement or manually by an operator.

As described above, the inventive semiconductor waste gas processing scrubber could safely discharge waste gas, which is produced in a semiconductor fabrication process, to the atmosphere after burning and certainly filtering the waste gas. In addition, the inventive scrubber allows the installation to be easily maintained and repaired. Furthermore, according to the inventive scrubber, it is possible to reduce an obstacle of the installation, which results from the inclusion of filtered particles into the installation during the settling/filtration of the particles after burning the waste gas.

According to the burner of the inventive semiconductor waste gas processing scrubber, it is possible to facilitate the mixing of fuel and oxygen, to prevent the mixed gas of the fuel and oxygen from being mixed with the waste gas, and to prevent intermixing of waste gas streams prior to burning the waste gas, whereby the efficiency of burning the waste gas can be increased.

According to the burning chamber of the inventive semiconductor waste gas processing scrubber and the particle removing apparatus mounted in the burning chamber, inert gas (e.g., nitrogen gas) is supplied to the interior of the burning chamber in a pulsed form, so that the inert gas provides a predetermined level of impulse to the inner wall of the burning chamber, whereby it is possible to prevent particles from depositing on the inner wall of the burning chamber.

According to the present invention, plural injection nozzles for injecting inert gas are provided in such a manner as to be spaced from each other and tilted by a predetermined angle with reference to the vertical direction of the burning chamber, so that the inert gas is supplied into the burning chamber naturally in a swirling form. Therefore, the particles can be more effectively removed and separated from the inner wall of the burning chamber. In fact, with the supply of inert gas according to the present invention, it can be confirmed that the cycle for cleaning the burning chamber is increased from once every three or four days to once every three or four months.

In addition, according to the present invention, inert gas may be supplied to the interior of the burning chamber in various forms, whereby unnecessary waste of inert gas could be prevented. For example, if the waste gas introduced into the burning chamber contains a large amount of silicon, the inert gas is continuously supplied in a pulsed form during the operation of the burner, and if the waste gas contains small amount of silicon, the inert gas is intermittently supplied for a predetermined length of time or supplied only when the pressure within the burning chamber approaches the atmospheric pressure, whereby the use of inert gas can be minimized.

According the wet tower of the inventive semiconductor waste gas processing scrubber, it is possible to interchange the positions of the first tower and the second tower, or to interchange the positions of the third tower and the fourth tower, whereby it is possible to operate the wet tower while optionally changing the wet tower in various forms according to the conditions of process and installation.

For this reason, it is possible to select and separate a desired tower from the wet tower. As a result, it is possible to selectively clean a desired tower, whereby the length of time required for cleaning can be extremely reduced.

According to the present invention, if the inner pressure is increased as the filters and impact plates are blocked by particles, inert gas with a predetermined pressure is forcibly supplied downwardly through the gas supply pipe, whereby it is possible to eliminate or alleviate the blocking phenomena caused by the particles and to increase the cleaning cycle.

For this purpose, according to the present invention, water could be simultaneously injected to the first filter installed in the first tower from the first injection nozzles arranged above the first filter and the second injection nozzles arranged below the first injection nozzles, whereby the amount of particles depositing or accumulating in the first filter can be minimized. Of course, the cleaning cycle can be further increased by this solution.

In addition, according to the present invention, the first and the second towers are provided with the first and second transparent windows, respectively, so that the first and second filters of the first and second towers can be visually seen. As a result, the time for cleaning the first and second filters can be precisely determined.

According to the present invention, the water reservoir tank of the inventive semiconductor waste gas processing scrubber and the particle removing apparatus installed therein periodically produce bubbles in the water reservoir tank. Therefore, particles could not deposit on the bottom of the water reservoir tank. Furthermore, even if the particles have already deposited or accumulated on the bottom of the water reservoir tank, the particles can be broken up and caused to float in the water by the bubbles and can then be discharged to the outside together with the water when the drain pump is operated. With this operation, it is also possible to increase the cycles for maintaining and repairing or cleaning the water reservoir tank.

Moreover, according to the present invention, the air wasted when operating the drain pump can be reused without adding any mechanism or instrument, whereby the manufacturing costs are not additionally increased.

Although a preferred embodiment of the present invention has been described for illustrative purposes, those skilled in the art will appreciate that various modifications, additions and substitutions are possible, without departing from the scope and spirit of the invention as disclosed in the accompanying claims.

What is claimed is:

1. A scrubber for processing semiconductor waste gas comprising:
   a supply section for supplying semiconductor waste gas, fuel and oxygen;
   a burner connected to the supply section so as to burn the semiconductor waste gas by flame;
   a burning chamber joined to the burner so as to cause particles, which are produced as the semiconductor waste gas is burnt, to drop;
   a wet tower installed at a side of the burning chamber so as to cause the particles, which are transferred from the burning chamber after adsorbing the particles using water, to drop;
   a water reservoir tank connected to the burning chamber and the wet tower so as to capture the particles which have dropped from the burning chamber and the wet tower; and
   a chamber support section, which is provided under the lower end of the burning chamber so as to support the burning chamber.

2. The scrubber as claimed in claim 1, wherein the supply section comprises:
   at least one waste gas supply tube connected to the burner so as to supply semiconductor waste gas to the burner;
   at least one bypass waste gas supply tube connected to the waste gas supply tube so as to bypass the semiconductor waste gas;
   at least one fuel supply tube connected to the burner so as to supply fuel to the burner; and
   at least one oxygen supply tube connected to the burner so as to supply oxygen to the burner.

3. The scrubber as claimed in claim 1, wherein the burner comprises:
   a main body having at least one semiconductor waste gas supply passage, at least one fuel supply passage, and at least one oxygen supply passage;
   a fuel nozzle body fitted on the circumferential edge of the main body, thereby forming a fuel supply space and a fuel supply nozzle; and
   an oxygen nozzle body fitted on the circumferential edges of the main body and the fuel nozzle body, thereby forming an oxygen supply space and an oxygen supply nozzle; and
   an assembly body fitted on the circumferential edges of the main body and the oxygen nozzle body, thereby forming a coolant flow space, the assembly body being connected to the burning chamber.

4. The scrubber as claimed in claim 3, wherein the main body comprises:
   an extension, which extends horizontally and radially outwardly substantially from the lower end of the main body to a predetermined extent and has at least one groove formed on the circumferential surface;
   a first flange positioned above the extension, the first flange extending horizontally and radially outwardly from the main body to an extent larger than that of the extension; and
   a second flange positioned above the first flange, the second flange extending horizontally and radially outwardly from the main body to an extent larger than that of the first flange, and
   wherein the at least one semiconductor waste gas supply passage extends substantially vertically through the main body, the at least one fuel supply passage extends vertically through the main body so that the outlet of the fuel supply passage is formed between the extension and the first flange, and the at least one oxygen supply passage extends vertically through the main body, so that the outlet of the oxygen supply passage is formed between the first and second flanges.

5. The scrubber as claimed in claim 4, wherein the groove formed on the main body is inclined in such a manner that the virtual extension line of the lower end thereof crosses the central axis of the main body, and wherein the main body is in close contact with the fuel nozzle body, so that the groove form a fuel nozzle, and the fuel nozzle body is in close contact with the extension and the first flange, so that a fuel space is formed between the main body and the fuel nozzle body.

6. The scrubber as claimed in claim 5, wherein the fuel nozzle body comprises:
   a central hole formed through the central part of the fuel nozzle body, into which hole the main body is fitted, and
   an extension formed around the lower end of the circumferential surface of the fuel nozzle body and radially extending to a predetermined extent, wherein at least one groove is formed on the circumferential surface of the extension.

7. The scrubber as claimed in claim 6, wherein the at least one groove formed on the extension of the fuel nozzle body is inclined in an angle larger than that of the groove formed on the extension of the main body, the fuel nozzle body is in close contact with the oxygen nozzle body, so that the at least one groove on the extension of the fuel nozzle body forms at least one oxygen nozzle, and the oxygen nozzle body is in close contact with the second flange of the main body and the at least one groove of the fuel nozzle body, so that one or more oxygen spaces are formed between the first and second flange and between the fuel nozzle body and the oxygen nozzle body.

8. The scrubber as claimed in claim 4, wherein the oxygen nozzle body comprises:
   a central hole formed through the central part of the oxygen nozzle body, into which hole the fuel nozzle body is fitted, and
   an extension formed around the lower end of the circumferential surface of the oxygen nozzle body and radially outwardly extending to a predetermined extent.

9. The scrubber as claimed in claim 8, wherein the assembly body comprises a central hole formed through the central part of the assembly body, into which hole the oxygen nozzle body is fitted, and a coolant flow space is formed between the outer circumferential surface of the oxygen nozzle body and the inner circumferential surface of the assembly body, a coolant pipe being connected to the coolant flow space.

10. The scrubber as claimed in claim 4, wherein the main body has an inverted conical surface, the vertex of which forms the lower end of the main body, and a blocking wall extending downward by a predetermined length around the conical surface.

11. The scrubber as claimed in claim 1, wherein the burning chamber comprises:
    a top cover, into the center of which the burner is fitted;
    an inner chamber depending from the bottom side of the top cover around the burner; and
    an outer chamber depending from the bottom side of the top cover around the inner chamber.

12. The scrubber as claimed in claim 11, wherein a cooling tube is provided in a space between the top cover and the outer chamber for supplying coolant, and at least one through-hole is formed in the cooling tube, so that the coolant is injected into the space between the inner chamber and the outer chamber.

13. The scrubber as claimed in claim 11, wherein the inner chamber consists of an upper inner chamber and a lower inner chamber, which are detachable from each other, and the outer chamber also consists of an upper outer chamber and a lower outer chamber, which are detachable from each other.

14. The scrubber as claimed in claim 11, wherein the burning chamber comprises:
    a pilot burner positioned at the lower end of the burner through the outer chamber and the lower chamber to implement initial ignition, and
    a UV sensor positioned at the lower end of the burner through the outer chamber and the inner chamber to detect whether the initial ignition is successfully implemented.

15. The scrubber as claimed in claim 11, wherein the burning chamber further comprises a particle removing gas supply section, which supplies a gas of predetermined pressure, so that particles do not accumulate on the inner wall of the burning chamber.

16. The scrubber as claimed in claim 15, wherein the particle removing gas supply section comprises:
    a gas supply tube joined to the outside of the top cover of the burning chamber;
    a gas tube connected to the gas supply tube, the gas tube being formed in a ring shape along the space between the top cover and the inner chamber; and
    at least one gas nozzle joined to the gas tube and extending by a predetermined length within the inner chamber.

17. The scrubber as claimed in claim 16, wherein the gas nozzle comprises:
    a straight part extending parallel to the inner wall of the burning chamber, and
    a curved bending toward the inner wall of the burning chamber from the end of the straight part, so that the gas could supply impulse to the inner wall of the inner chamber.

18. The scrubber as claimed in claim 16, wherein there is provided four gas nozzles, which are arranged centering on the center of the inner chamber and spaced from each other in an angular space of 90 degrees.

19. The scrubber as claimed in claim 16, wherein the gas nozzles are inclined with reference to the vertical direction of the inner chamber, so that the gas can be supplied in a swirl form within the inner chamber.

20. The scrubber as claimed in claim 16, the gas supplied through the particle removing gas supply section is an inert gas.

21. The scrubber as claimed in claim 16, wherein the gas supplied through the particle removing gas supply section is supplied in a pulsed form.

22. The scrubber as claimed in claim 16, wherein a substantially funnel-shaped lower chamber is detachably attached to the lower part of the outer chamber of the burning chamber, and a particle guide member is incorporated in the inside of the lower chamber, the guide chamber being substantially funnel-shaped toward the lower end of the lower chamber so as to guide the particles produced after the burning of waste gas to the wet tower and the water tank.

23. The scrubber as claimed in claim 22, wherein the particle guide member further comprises an inert gas tube for injecting inert gas so as to prevent vapor, which is produced in the water reservoir tank, from being introduced into the burning chamber.

24. The scrubber as claimed in claim 22, wherein the lower chamber is provided with a chamber support section for supporting the burning chamber and allowing the burning member to be separated.

25. The scrubber as claimed in claim 24, wherein the chamber support section comprises:
    a pair of guide rails linearly installed on a support plate;
    a pair of guide blocks mounted on the guide rails 1420 so as to be capable of reciprocating in the horizontal direction;
    a pair of support dies mounted on the guide blocks and extending upward by a predetermined distance, each of the support dies having a horizontal surface formed at the top portion thereof and a descent surface extending downward from the horizontal surface in a predetermined angle; and
    one or more support rods for interconnecting the support dies, the lower chamber being provided with rollers, which are mounted to be slidable along the horizontal surfaces or the descent surfaces of the support dies.

26. The scrubber as claimed in claim 1, wherein the wet tower comprises:
    a cylindrical base tower having base injection nozzles;
    a cylindrical first tower removably mounted on the top of the base tower, a first filter and first nozzles being provided within the first tower;
    a cylindrical second tower removably mounted on the top of the first tower, a second filter and second nozzles being provided within the second tower;
    a cylindrical third tower removably mounted on the top of the second tower, a third filter and third nozzles being provided within the third tower; and
    a cylindrical fourth tower removably mounted on the top of the third tower, plural impact plates and a gas supply pipe being provided within the fourth tower, wherein the first tower and the second tower can be assembled in varying order and the third tower and fourth tower can be also assembled in varying order.

27. The scrubber as claimed in claim 26, wherein the first tower and the second tower are identical with each other in height and diameter, and the third tower and the fourth tower are identical with each other in height and diameter, and the diameter of the first and second towers is different from that of the third and fourth towers.

28. The scrubber as claimed in claim 26, wherein the porosities of the first filter, the second filter, and the third filter decrease in the order of the first filter, the second filter and the third filter.

29. The scrubber as claimed in claim 26, wherein fresh water is supplied through the base injection nozzles, and water purified from the water reservoir tank is supplied through the first, second and third injection nozzles.

30. The scrubber as claimed in claim 26, wherein a top-opened cover is fitted on the top of the fourth tower, a first exhaust tube having a pressure sensing port, a temperature sensing port and a cool air supply port is connected to the cover, and a second exhaust tube is connected to the top end of the first exhaust tube, the second exhaust gas having a exhaust amount control member, so that the exhaust amount can be controlled.

31. The scrubber as claimed in claim 26, wherein the base tower is connected to the burning chamber and the water reservoir tank through an intermediate connection tube and a lower connection tube, and the base injection nozzles are arranged in such a manner as to be capable of injecting water upward toward the first filter installed in the first tower.

32. The scrubber as claimed in claim 26, wherein the base tower further comprises a pressure sensing port so as to sense the pressure within the base tower.

33. The scrubber as claimed in claim 26, wherein the first injection nozzles of the first tower are arranged above the first filter in such a manner as to be capable of injecting water downward toward the first filter.

34. The scrubber as claimed in claim 26, wherein the first tower further comprises a transparent first window, which is formed in the wall of the first tower, so that the first filter within the first tower can be visually seen.

35. The scrubber as claimed in claim 26, wherein the second injection nozzles of the second tower are arranged above the second filter in such a manner as to be capable of injecting water downward toward the second filter.

36. The scrubber as claimed in claim 26, wherein the second tower further comprises a transparent second window, which is formed in the wall of the second tower, so that the second filter within the first tower can be visually seen.

37. The scrubber as claimed in claim 26, wherein the third injection nozzles of the third tower are arranged above the third filter in such a manner as to be capable of injecting water downward toward the third filter.

38. The scrubber as claimed in claim 26, wherein the impact plates of the fourth tower are each formed with plural through-holes and are stacked to be vertically spaced from each other, the through-holes formed in adjacent two impact plates are staggered from each other, and the gas supply pipe is arranged above the impact plates in such a manner as to be capable of supplying inert gas downward toward the impact plates.

39. The scrubber as claimed in claim 1, wherein the water reservoir tank comprises:
  a first region assembled under the burning chamber and the wet tower so as to capture water and particles which have dropped from the burning chamber and the wet tower,
  a second region separated from the first region by a partition and supplied with particle-filtered water from the first region, and
  a filtration section interposed between the first and second regions so as to filter particles from the water.

40. The scrubber as claimed in claim 39, wherein a drain pump is additionally connected to the first region for discharging the water and particles to the outside in unison.

41. The scrubber as claimed in claim 40, wherein the drain pump has fluid inlet and outlet ports so as to suction and discharge water and particles, and air inlet and outlet ports for supplying pneumatic pressure to the drain pump so as to operate the drain pump, at least one bubbler being connected to the air outlet port via a pipe and sinking to a predetermined depth in the water of the first region of the water reservoir tank.

42. The scrubber as claimed in claim 41, wherein the drain pump is a pneumatic diaphragm pump.

43. The scrubber as claimed in claim 41, wherein the bubbler is a noise reducer for reducing noise from the drain pump.

44. The scrubber as claimed in claim 41, wherein the bubbler gene-rates bubbles in the water contained in the water reservoir tank each time air is discharged from the drain pump, so that the particles captured in water continuously float in the water without depositing or accumulating on the bottom of the water reservoir tank.

45. The scrubber as claimed in claim 41, wherein the inlet port of a circulation pump is connected to the second region of the water reservoir tank, and the outlet port of the circulation pump is connected to the wet tower through a heat exchanger.

* * * * *